US007644335B2

(12) United States Patent
Luby et al.

(10) Patent No.: US 7,644,335 B2
(45) Date of Patent: Jan. 5, 2010

(54) IN-PLACE TRANSFORMATIONS WITH APPLICATIONS TO ENCODING AND DECODING VARIOUS CLASSES OF CODES

(75) Inventors: Michael G. Luby, Berkeley, CA (US); M. Amin Shokrollahi, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 610 days.

(21) Appl. No.: 11/423,376

(22) Filed: Jun. 9, 2006

(65) Prior Publication Data

US 2006/0280254 A1  Dec. 14, 2006

Related U.S. Application Data

(60) Provisional application No. 60/689,632, filed on Jun. 10, 2005.

(51) Int. Cl.
*H03M 13/05* (2006.01)
(52) U.S. Cl. .................................. 714/752; 714/784
(58) Field of Classification Search .............. 714/752, 714/784
See application file for complete search history.

(56) References Cited

U.S. PATENT DOCUMENTS 5,517,508 A * 5/1996 Scott ........................... 714/776
5,583,784 A * 12/1996 Kapust et al. ................. 702/77
6,466,698 B1   10/2002 Creusere
6,909,383 B2    6/2005 Shokrollahi
7,219,289 B2 *  5/2007 Dickson ..................... 714/752
2004/0207548 A1 10/2004 Kilbank
2005/0138286 A1  6/2005 Franklin et al.

OTHER PUBLICATIONS

International Search Report, PCT/US2006/022914—International Search Authority—US, Feb. 9, 2007.
Written Opinion, PCT/US2006/022914—International Search Authority—US, Feb. 9, 2007.
Bloemer, et al.: "An XOR-Based Erasure Resilient Coding Scheme," TR-95-048, International Computer Science Institute in Berkley, CA (1995).

\* cited by examiner

*Primary Examiner*—Stephen M Baker
(74) *Attorney, Agent, or Firm*—Jeff Jacobs

(57) ABSTRACT

In an encoder for encoding symbols of data using a computing device having memory constraints, a method of performing a transformation comprising loading a source block into memory of the computing device, performing an intermediate transformation of less than all of the source block, then replacing a part of the source block with intermediate results in the memory and then completing the transformation such that output symbols stored in the memory form a set of encoded symbols. A decoder can perform decoding steps in an order that allows for use of substantially the same memory for storing the received data and the decoded source block, performing as in-place transformations. Using an in-place transformation, a large portion of memory set aside for received data can be overwritten as that received data is transformed into decoded source data without requiring a similar sized large portion of memory for the decoded source data.

44 Claims, 24 Drawing Sheets

|       |   |
|-------|---|
| $L$   | $A$ |
| $0$   | $I$ |

$N'$

|         |              |
|---------|--------------|
| $L^{-1}$| $-L^{-1}\cdot A$ |
| $0$     | $I$          |

$N'^{-1}$

FIGURE 16

IN-PLACE TRANSFORMATIONS WITH APPLICATIONS TO ENCODING AND DECODING VARIOUS CLASSES OF CODES

CROSS-REFERENCES TO RELATED APPLICATIONS

This application claims the benefit of and is a non-provisional of U.S. Patent Application Ser. No. 60/689,632 filed on Jun. 10, 2005, which is incorporated by reference in its entirety for all purposes.

FIELD OF THE INVENTION

The present invention relates generally to encoding and decoding data and more particularly calculating linear transformations of data without requiring use of extensive additional memory.

BACKGROUND OF THE INVENTION

Numerous applications achieve their results by transforming a given block of data, referred to as a "source block" hereafter. As used here, the word "source block" refers to any data that is stored at one or more sources. Thus, a document, an image, and a file from a file server or computer storage device are all examples of source blocks. Source blocks can be of unknown size (such as a source block taken from the output of a streaming source) or they can be of known size (such as a one megabyte image stored on a hard disk). Either way, a source block is a sequence of one or more source symbols, where each source symbol is a piece of data in the source block that has a position in the source block and a value.

Herein, transformation of a source block refers to an action performed on the source block to achieve a certain result. For example, where a source block is captured by an external device, such as a camera, one possible transformation could amount to the compression of the source block to a size significantly less, to facilitate its storage on smaller storage devices, or to facilitate faster transmission to one or more possible intended recipients. As another example, the source block could be designated for transport over a channel such as a computer network, or a channel in which there is an expectation of corruption or loss. In such a case, the source block may be transformed before transmission so as to increase its robustness with respect to transmission errors.

Of the many applications requiring transformations of source blocks, ones of particular interest are those that perform a transformation to increase the robustness of the source block towards errors incurred in a transmission. Transmission is the process of transmitting a source block from one or more senders to one or more recipients through a channel in order to deliver the source block. If one sender is connected to any number of recipients by a perfect channel, the received data can be an exact copy of the original source block, as all the data will be received correctly. However, where the channel is not perfect, which is the case for most real-world channels, or the data emanates from more than one sender, which is the case for some systems, what is received might not be an exact copy.

Channel imperfections can refer to data erasures, data incompleteness, or data corruption. The act of data transmission does not only refer to the transmission of data between geographically distant locations, and transmission can also include cases in which the data is never physically moved. For example, source blocks stored on a storage medium in which there is a possibility of defects could constitute a form of transmission, as there is a possibility of data corruption when the source block is accessed again.

A common process for protection of source blocks against possible transmission errors is that of coding. With coding, a source block is transformed or a new set of data (sometimes called "redundant" or "repair" data) is computed from the source block. The transformed source block often contains redundant information computed from the original source block, with the goal of using the internal redundancies to obtain information about the errors incurred during the transmission, and correcting such errors. There is a large body of literature on the theory and practice of designing and using codes.

The choice of the code depends on the particular application, and on the communications channel on which transmission is to be conducted. Often, the chosen code has some linearity properties. For example, where the source blocks are made up of one or more source symbols that are groups of bits, the linearity condition would guarantee that the coding of the symbol-wise sum (mapping) of two source blocks is equal to the symbol-wise sum (mapping) of the codings of the source blocks. Such linearity conditions can be used with great advantage to describe and calculate the encoding and the decoding processes. A large sub-class of codes used in practice satisfy such linearity conditions.

The inverse process to the transformation leading to the encoding of a source block is the decoding process. In this process, a (possibly corrupted) version of the encoded source block is processed in such a way as to obtain a good (or sometimes the best possible) estimate of the original state of the source block before transmission.

One of the many benefits of linear coding schemes is the fact that the encoding and decoding processes can be explained by matrices. Matrices are mathematical objects containing entries in form of a two-dimensional array. As is well-known to people of skill in the art, matrices can be conveniently used to represent linear mappings between objects, for example between sets of symbols comprising source blocks.

Often times, the encoding and the decoding process may benefit from the use of additional memory to store intermediate results. For example, some decoding processes may require keeping a copy of the received data in addition to the decoded source block. The amount of additional memory needed for the decoding and encoding processes may be too large on devices with limited memory. For example, where the device is a mobile receiving device, like a mobile phone or a Personal Digital Assistant (PDA), the memory on the device may be small, and/or the memory may have been reserved for other applications intended to run on the device. In such situations, decoding and encoding processes should use memory efficiently, but sometimes this is difficult to implement.

BRIEF SUMMARY OF THE INVENTION

In an embodiment of a decoder according to aspects of the present invention, the decoder is programmed to perform decoding steps in an order that allows for use of substantially the same memory for storing the received data and the decoded source block, performing as in-place transformations. Using an in-place transformation, a large portion of memory set aside for received data can be overwritten as that received data is transformed into decoded source data without requiring a large portion of memory for the received data and a similar sized large portion of memory for the decoded source data.

Often, the use of in-place transformations leads to a decrease in the running time of a particular process, as the process will spend less time accessing memory, providing benefits beyond just reduced memory requirements. This avoids the problem wherein if the total size of the stored data is too large, then a processing unit may be forced to access secondary, slower storage devices.

Embodiments of the present invention use methods and processes for performing in-place linear transformations without requiring the use of extensive additional memory. These methods and processes can be used with FEC encoding and decoding transformations of source blocks.

The following detailed description together with the accompanying drawings will provide a better understanding of the nature and advantages of the present invention.

BRIEF DESCRIPTION OF THE DRAWINGS

The text and equations herein illustrate aspects of the present invention.

FIG. 12 illustrates a matrix and a transformation thereof.

FIG. 14 illustrates a matrix and a transformation thereof.

FIG. 16 illustrates a matrix and a transformation thereof.

DETAILED DESCRIPTION OF THE INVENTION

Processes that substantially use the same memory for storing the received data and the decoded source block are often referred to as in-place transformations. Often times, the use of in-place transformations leads to a decrease in the running time of a particular process, as the process will spend less time accessing memory. This is particularly important because if the total size of the stored data is too large, then the processing unit may be forced to access secondary, slower, storage devices. Embodiments of the present invention use methods and processes for performing in-place linear transformations without requiring the use of extensive additional memory. These methods and processes are particularly applicable to FEC (forward error correction) encoding and decoding transformations of source blocks.

While the invention is applicable to many devices, not all are explicitly described herein. Examples, but not by way of limitation, include mobile telephones, computers, handheld computing devices, media players, communication devices, and/or hardware and/or software to implement those devices.

Overview

Figure 1:
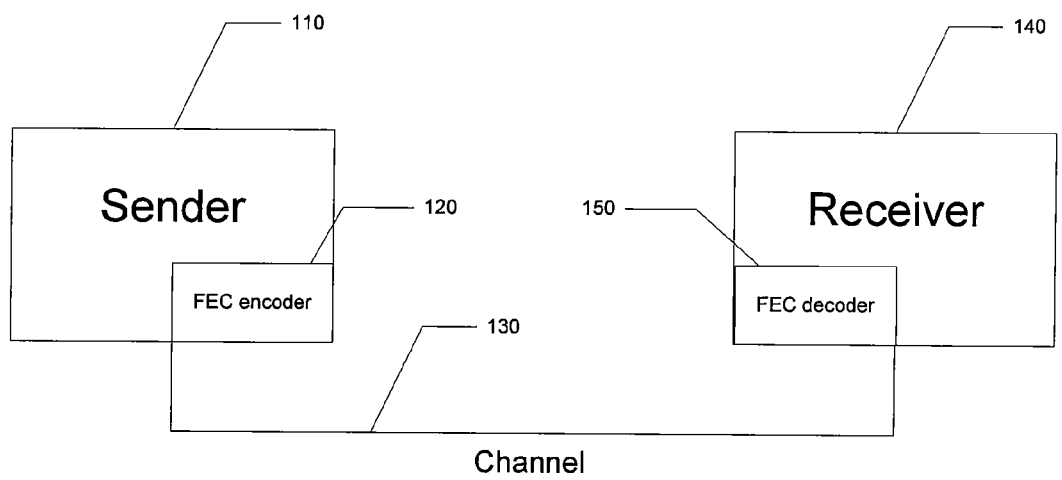
FIG. 1 is a high-level diagram of a communication system that employs FEC encoding according to embodiments of the present invention.

A high-level diagram of a communication system that employs FEC encoding at a sender 110 and FEC decoding at a receiver 140 is shown in FIG. 1. It should be understood that sender 110 and receiver 140 could comprise a wide range of devices. In many embodiments, the sender and receiver are contained within a single transceiver device and two or more such devices can communicate among themselves.

In FIG. 1, the sender 110 includes an FEC encoder 120 that is used to add protection to data that is sent over a communications channel 130 to receiver 140 that includes an FEC decoder 150. Sender 110 may send the data generated by FEC encoder 120 in packets, e.g., Internet Protocol (IP) packets or other form of packets, that include identifying information in each packet that allow receiver 140 to determine how the data in that packet was generated and/or what portion of the sent data it represents.

Channel 130 may be a network channel, wireless channel, PSTN channel, or other channel. Typically, channel 130 will have some constraints under which, for some conditions, data is lost. Typically, for a packet network, if a portion of a received packet is not readable, the entire packet is discarded. Thus, there are situations wherein a packet sent from sender 110 is not deemed received at receiver 140, so mechanisms are needed to recover from such losses.

Receiver 140 provides FEC decoder 150 with as many as necessary of the received packets, and FEC decoder 150 recovers all or parts of the data. FEC (forward error correction) provides for mechanisms that are provided in advance on the forward channel to allow for error correction if it occurs. Errors are not required, in which case the FEC efforts are just a backup, and in some cases, more errors might occur than can be recovered using FEC, in which cases the communication fails or a side communication occurs where retransmission, etc. are requested.

Figure 2:
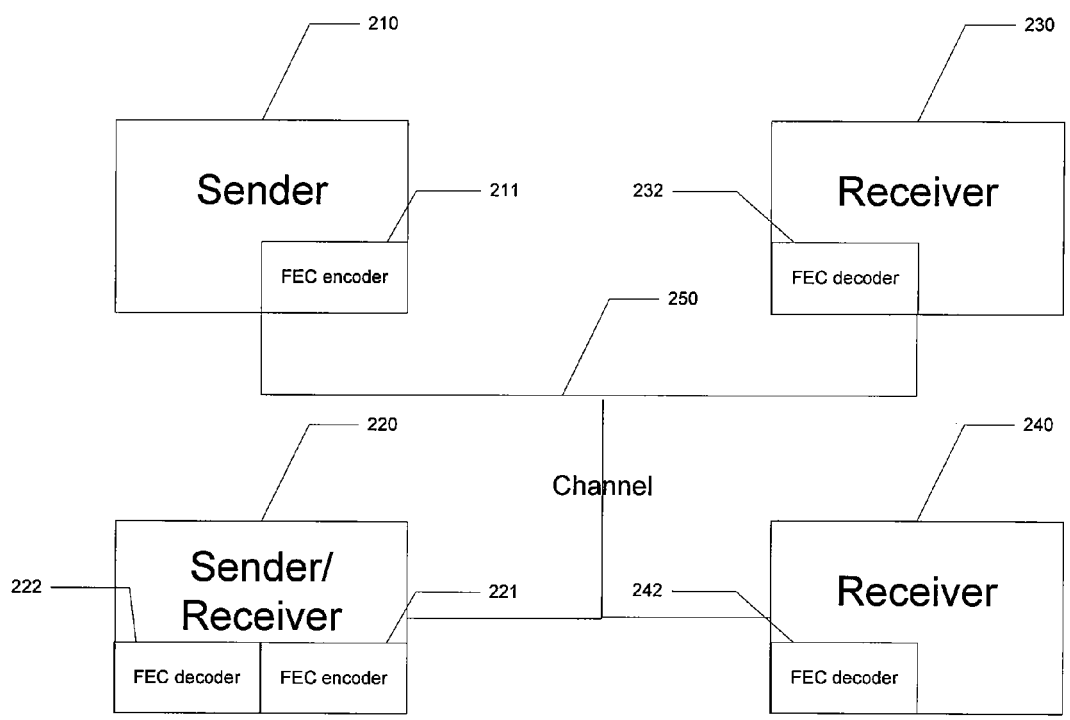
FIG. 2 shows a communication system like that of FIG. 1, but having multiple senders and receivers.

Transmission need not be point-to-point. As shown in FIG. 2, a system can have multiple senders and multiple receivers. FIG. 2 shows a system including a sender 210, receivers 230, 240 and a sender/receiver 220, each including an FEC encoder (211), an FEC decoder (232, 242), or both (222, 221). In the example shown in FIG. 2, all the senders, sender/receivers and receivers can communicate over a channel 250, which could include an integrated IP network, a combination of disjoint networks, or other similar combinations of networks.

Figure 3:
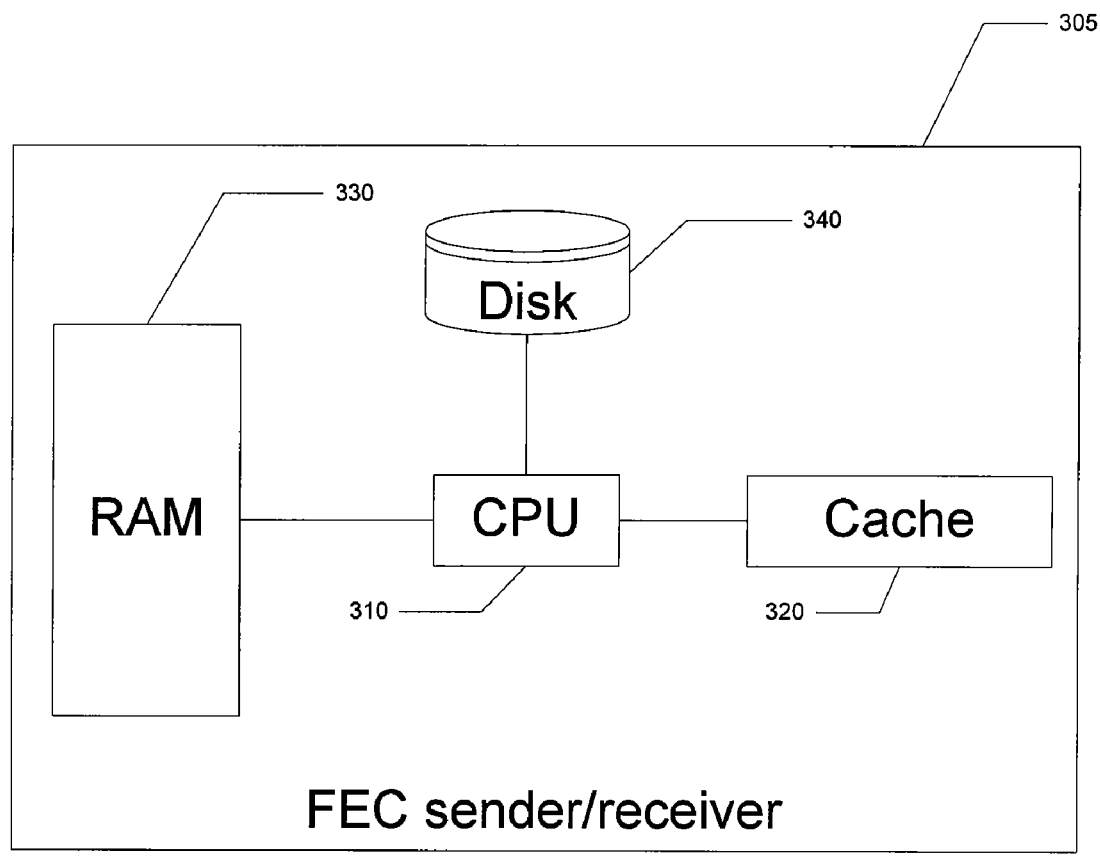
FIG. 3 illustrates an example of hardware that might be used to implement a sender and/or receiver.

FIG. 3 illustrates an example of hardware that might be used to implement a sender and/or receiver, in more detail. As shown there, an FEC encoder/decoder 305 includes a CPU 310 that is used for performing operations, a cache 320 that provides temporary memory with very fast access for the CPU 310, a RAM 330 that provides a larger amount of memory with relatively fast access for the CPU 310, and disk 340 that provides a large amount of permanent memory with reasonable access speeds for the CPU 310.

Many other variations of this embodiment are possible. For example, the cache 320 may be partitioned into a portion that is controlled by the Operating System (OS) and a part that is under the control of the FEC encoding/decoding process, to preload data from other memory devices in order to prepare for processing by the CPU, i.e., Direct Memory Access (DMA) operations. As other examples, there may be more than one level of cache, there may be other types of storage devices such as FLASH, and some of the storage types may be missing, e.g., disk storage.

More generally, a computing device that has memory often has varying classes of memory. Some classes of memory are deemed "closer" than others in that closer memory might be physically closer to the processor or have a faster response rate, which allows a processor to read and/or write the memory faster than a memory that is farther away, requiring longer leads, or is slower. Even more generally, one class of memory can be preferred over another class because of latency, response rate, amount of energy needed to read/write locations of the memory, amount of energy to sustain the information in the memory, cost per bit and other considerations. The classes of memory can typically be ordered by preference, with the fastest, most power efficient memory being preferred. Typical engineering and design constraints may dictate the use of multiple classes of memory. For example, one might not want only RAM cache memory, because then no permanent storage is possible and one might not want only disk memory, because then processor access is slow.

As just explained above, a device can have different classes of memory, with the classes ordered by preference. When the most preferred memory is not large enough to contain the results of a particular computation operation, memory management might be required, such as swapping out to a less preferred class of memory. Such operations add overhead in terms of latency, computational cost, power usage, especially in certain devices and for certain operations, and therefore methods and apparatus described herein for efficient in-place transformations provide great benefit to operations of the device.

In the illustration of FIG. 3, FEC encoder/decoder 305 might control various memory units and there may be other parts that are under the control of the application that is using the FEC encoder/decoder 305. Thus, for example, when performing FEC encoding, the application may control its own copy of the source block to be encoded, and the FEC encoder may have its own copy of the source block passed to it by the application in a separate memory location.

In this example, it may be important to minimize the memory used by the FEC encoder irrespective of the other memory used by the application, and it also may be the case in this example that the FEC encoder can overwrite portions of or all of the source block during its computation of the repair symbols for the source block since the application has its own separate copy of the source block and/or since the application may have already sent part of the source block to the channel and no longer needs to keep copies of these parts of the source block. As another example, generally during FEC decoding it is unimportant to maintain copies of encoding symbols once they have been used to recover the original source symbols of the source block.

Figure 4:
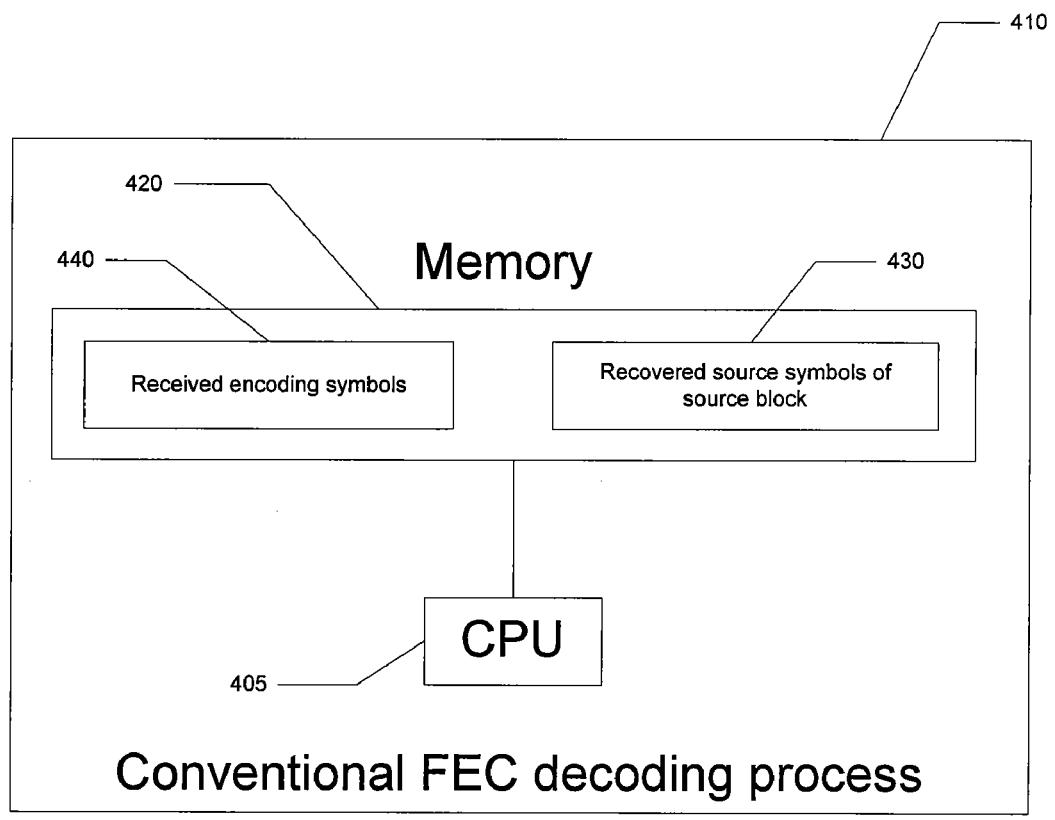
FIG. 4 illustrates a conventional FEC decoding process.

FIG. 4 illustrates a conventional FEC decoding process 410 (perhaps implemented as program code) that might use a CPU 405 to generate a source block of source symbols 430 from received encoding symbols 440 stored in a memory 420, where memory 420 may include types shown in FIG. 3 or other types. As shown, the amount of memory needed by the FEC decoding process 410 for symbol storage is typically the total size of the source block plus the total size of the encoding symbols. Similar comments hold for conventional FEC encoding processes.

Figure 5:
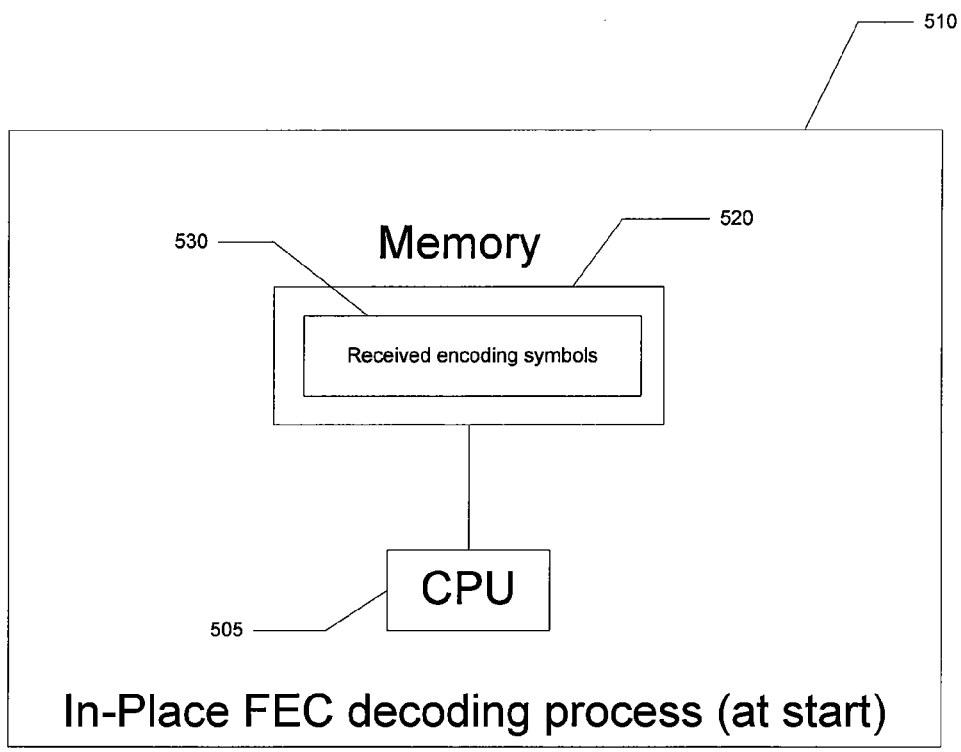
FIG. 5 illustrates an embodiment of an in-place FEC decoding process according to the present invention.
Figure 5:
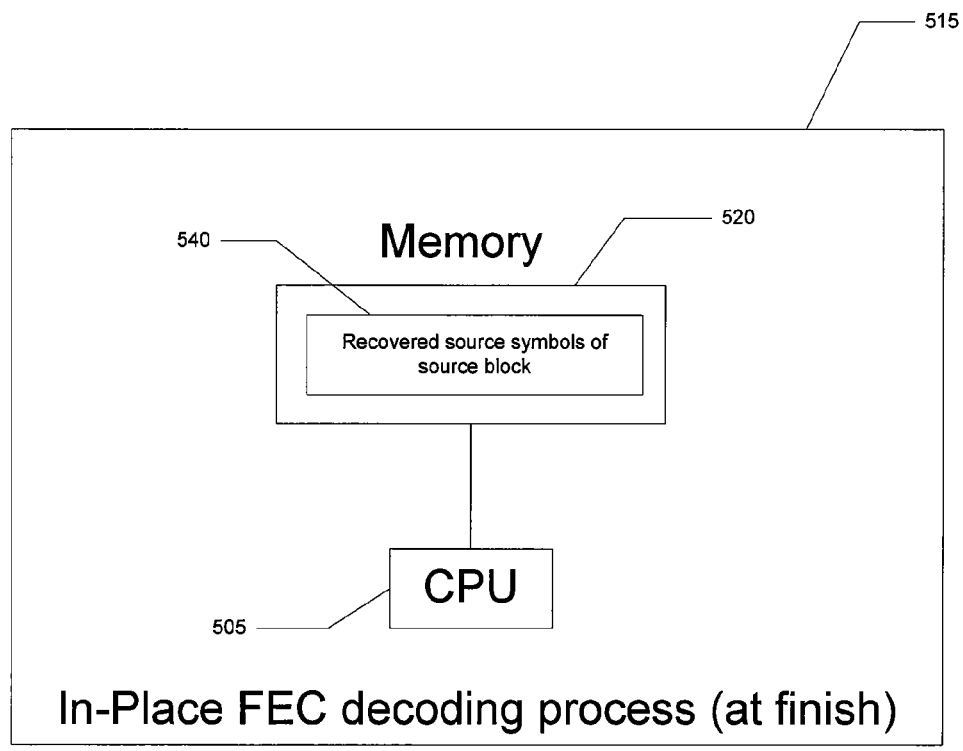

FIG. 5 illustrates an embodiment of an in-place FEC decoding process according to the present invention. The snapshot of the In-Place FEC Decoding Process at start 510 shows a CPU 505 to process received encoding symbols 530 stored in memory 520, where memory 520 may include types shown in FIG. 3 or other types. The snapshot of the In-Place FEC Decoding Process at finish 515 shows the CPU 505 that was used to produce the recovered source symbols of the source block 540 stored in the same memory 520 as originally occupied by the received encoding symbols 530. In addition, during the intermediate steps of the FEC decoding process, the memory used for symbols is a small amount larger than the maximum of the amount of memory needed to store the received encoding symbols 530 and the amount of memory needed to store the recovered source symbols 540. Thus, since the total size of encoding symbols needed to recover the source block is around the size of the source block, the in-place FEC decoding process 510 and 515 uses around one-half the memory of a conventional FEC decoding process 410 for symbol storage during decoding. Similar comments hold for in-place FEC encoding processes.

In subsequent sections we introduce methods and processes that realize the advantages depicted in FIG. 5. In particular, we introduce in-place FEC encoding and decoding processes for FEC codes that can be expressed as linear codes.

Linear Operators

To illustrate an example embodiment further, we will make use of the mathematical concept of a ring. In the following description, it should be understood that various mathematical processes and steps can be performed by a computing/communication device by operation of hardware, execution of program instructions, or similar.

As is well-known to those of ordinary skill in the art, a ring is a set on which two operations, addition and multiplication, are defined such that these operations satisfy the distributive laws. Moreover, the set considered with addition alone forms an abelian group, i.e., the result of an addition is independent of the ordering of the summands, there is a neutral element 0 for addition, and for each element there is another element such that the sum of these elements is 0. The other requirement is that the multiplication has a neutral element 1, such that multiplication of any element with 1 does not change the value of that element. For a general ring, we do not require that any nonzero element has a multiplicative inverse, nor do we require that multiplication is commutative. When both these conditions are satisfied, however, then we call the ring a "field." This notation is a standard one in the area of algebra.

As used herein, "symbol" refers to a piece of data that is typically smaller than the source block. The size of a symbol can often be measured in bits, where a symbol has the size of M bits and the symbol is selected from an alphabet of $2^M$ symbols. In applications of reliable transmission of information over packet networks, for example, the size of a symbol could be equal to the packet size, or it could be smaller, so that each packet contains one or more symbols.

A mapping (symbol-wise sum) is a logical construct implementable in hardware and/or software, etc. that maps pairs of symbols of the same size to another symbol of that size. We denote this mapping by "$\oplus$", and the image of this map on the pair (S, T) of symbols by $S \oplus T$. An example of such a mapping is the bit-wise exclusive-or (XOR).

Another construct used here is that of the "action" of a special type of sets on symbols. Suppose that A is a set equipped with a commutative addition operation "+" that has a neutral element and that, for every element, contains its additive inverse. Such a set is also commonly called an abelian group. An "action" of this group on the set of symbols is a mapping that maps a pair, comprising a group element r and a symbol S, to another symbol. We denote the image by r*S where this mapping respects addition in the group, i.e., for every pair of elements a and b in the group A, (a+b)*S=a*S⊕b*S. If A is a ring and the action also respects multiplication in A, where the multiplication operator in A is "·", i.e., (a·b)*S=a*(b*S), then this action is called an "operation."

Examples of rings or fields operating on symbols are abundant. A few examples are mentioned below. This list of examples is meant for illustrative purposes only, and should not be considered an exhaustive list, nor should it be construed to limit the scope of this invention.

The field GF(2) consisting of 0 and 1, with addition being exclusive-or (XOR) and multiplication being the logical operation AND, operates on the set of symbols by defining 1*S=S, and 0*S=0, wherein S denotes an arbitrary symbol and 0 denotes the symbol consisting entirely of zeros.

The field GF(4) consists of four elements 0, 1, 2, 3, wherein addition is the normal XOR of integers, and multiplication is defined via Table 1.

TABLE 1

Products for GF(4)

|   | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 |

It operates on symbols of even size in the following way: for such a symbol S we denote by S[1] and S[2] its first and second half, respectively, so that S=(S[1], S[2]). Then, we define $0*S=0$ $1*S=S$ $2*S=(S[2], S[1]\oplus S[2])$ $3*S=(S[1]\oplus S[2], S[1])$.

It can be verified quickly that this is indeed a valid operation. Another operation of the same field can be defined on symbols with 2 bits. Identifying these symbols with the integers 0, 1, 2, and 3, it can be seen that the multiplication table of the field describes an operation that coincides with the operation defined above in the case of 2-bit symbols.

More generally, if K is an extension field of GF(2) of degree d, then an operation of the field can be defined on symbols whose size is divisible by d. Such an operation is described in Bloemer, et al., "An XOR-Based Erasure Resilient Coding Scheme", published as Technical Report Number TR-95-048 of the International Computer Science Institute in Berkeley, Calif. (1995). This scheme uses the so-called "regular representation" of the field K as d×d matrices with binary entries.

The concept of a "linear transformation" can be defined with reference to the concept of an operation of a ring on symbols. For given integers m and n, a linear transformation induced by the operation maps vectors of n symbols into vectors of m symbols using the space of matrices with entries in the specified ring. A matrix over the ring R is a 2-dimensional collection of entries, whose entries belong to R. If a matrix has m rows and n columns, then it is commonly referred to as an m×n matrix. The pair (m,n) is called the "format" of the matrix. Matrices of the same format can be added and subtracted, using the addition and subtraction in the underlying field or ring. A matrix of format (m,n) can be multiplied with a matrix of format (n,k) as is commonly known, yielding a matrix of format (m,k).

If B denotes such a matrix, and B[j,k] denotes the entry of B at position (j,k), and if this matrix transforms the vector (S[1], S[2], . . . , S[n]), and if (X[1], X[2], . . . , X[m]), denotes the transformed vector, then the following relationship is valid:

for all j from 1 to m, $X[j]=B[j,1]*S[1]\oplus B[j,2]*S[2]\oplus \ldots \oplus B[j,n]*S[n]$.

If S denotes the column vector comprising S[1], S[2], . . . , S[n], and X denotes the column vector comprising the symbols X[1], X[2], . . . , X[m], then the transformation can be expressed as $X=B\otimes S$.

The above formula describes a process for calculating X from B and S in an encoder or decoder, referred to as a "simple transformation process" that can be performed by the steps of:

1. Set j to 1, and X[j] to 0.
2. For values of k from 1 to n do $X[j]=X[j]\oplus B[j,k]*S[k]$.
3. Increment j by 1. If j is larger than m, then stop, otherwise go to Step 2.

Such linear transformations are commonplace in a variety of applications. For example, when using a linear code to encode a piece of data, or source block, S could be the source symbols of the source block to be encoded, X could be the encoded version of S, and B could be a generator matrix for the code. In other applications, for example where the code used is systematic, X could be the redundant symbols of the encoding of S, while B could be the matrix describing the dependency of the redundant symbols on the source symbols. In yet other applications, S could be a vector of symbols obtained from a set of symbols received after transmission, and X could correspond to a set of symbols that are either completely or partially unknown, and B could describe the relationship between X and S. Such is, for example, the case when decoding Reed-Solomon codes in face of erasure, or in face of errors. The latter is described in great detail in U.S. Pat. No. 6,631,172 entitled "Efficient List Decoding of Reed-Solomon Codes for Message Recovery in the Presence of High Noise Levels," issued to Shokrollahi et al.

In many applications, the vector X above may need to be computed from S without use of substantial memory beyond the memory used for storing S. For example, where symbols are 512 bytes each, and m=n=1024, S and X are of size 512 kilobytes each. If the transformation is to be implemented on a device that has 600 kilobytes of memory, there would not be enough memory to simultaneously hold both S and X without the use of additional memory.

In such situations, a process is needed in which the transformation of S is accomplished in-place. If X is smaller than S, then this could mean that the first m entries of S are replaced by X, or more generally, that a prescribed set of m positions of S are replaced by the positions of X. Where X is larger than S, then the in-place transformation could be interpreted as S containing the first n entries of X after the transformation, or more generally, S containing a prescribed set of n entries of X after the transformation, with the remaining m-n entries stored elsewhere. If X and S are of the same length, then the in-place transformation can replace S by X. In applications, the process should not use too much additional memory to accomplish its task. Thus, for example, a solution in which X is calculated and stored elsewhere, and then copied into the memory locations of S would be an inadequate solution.

In-Place Linear Transformations

Processes are now described for in-place linear transformations. Let B be a matrix with format (m,n) and let S be a column vector of n symbols. Given B and S, define B↓S, the in-place linear matrix transformation of S by B in the downward direction, as follows:

For all i=1, 2, . . . , m

Replace S[i] with the inner product of the i-th row of B and the current S.

A process that computes this in-place operation is explained with reference to FIG. 6. In Step 610, the integer variable i is initialized to zero. In Step 620 the value of i is increased to next(i), where next(i) is the smallest integer greater than i such that row next(i) of B has at least one non-zero entry, and next(i) is set to m+1 if all rows beyond row i have all zero entries. In Step 630 it is checked whether or not i>m, and if i>m then processing stops at Step 640, but if i≦m then processing proceeds to Step 650 where a temporary symbol value T is set to zeroes and the integer variable j is set to zero. In Step 660 the value of j is increased to next (i,j), where next (i,j) is the smallest integer>j such that in row i of B, B[i,next(i,j)] is a non-zero entry, and next (i,j) is set to n+1 if all entries beyond B[i,j] row i are all zeroes. In Step 670 it is checked whether or not j>n, and if j>n then processing proceeds to Step 680 where symbol S[i] is set to T and then processing returns to Step 620. If j≦n in Step 670 then processing proceeds to Step 690 where temporary symbol value T is reset to T⊕B[i,j]*S[j] and then processing returns to Step 660.

Figure 6:
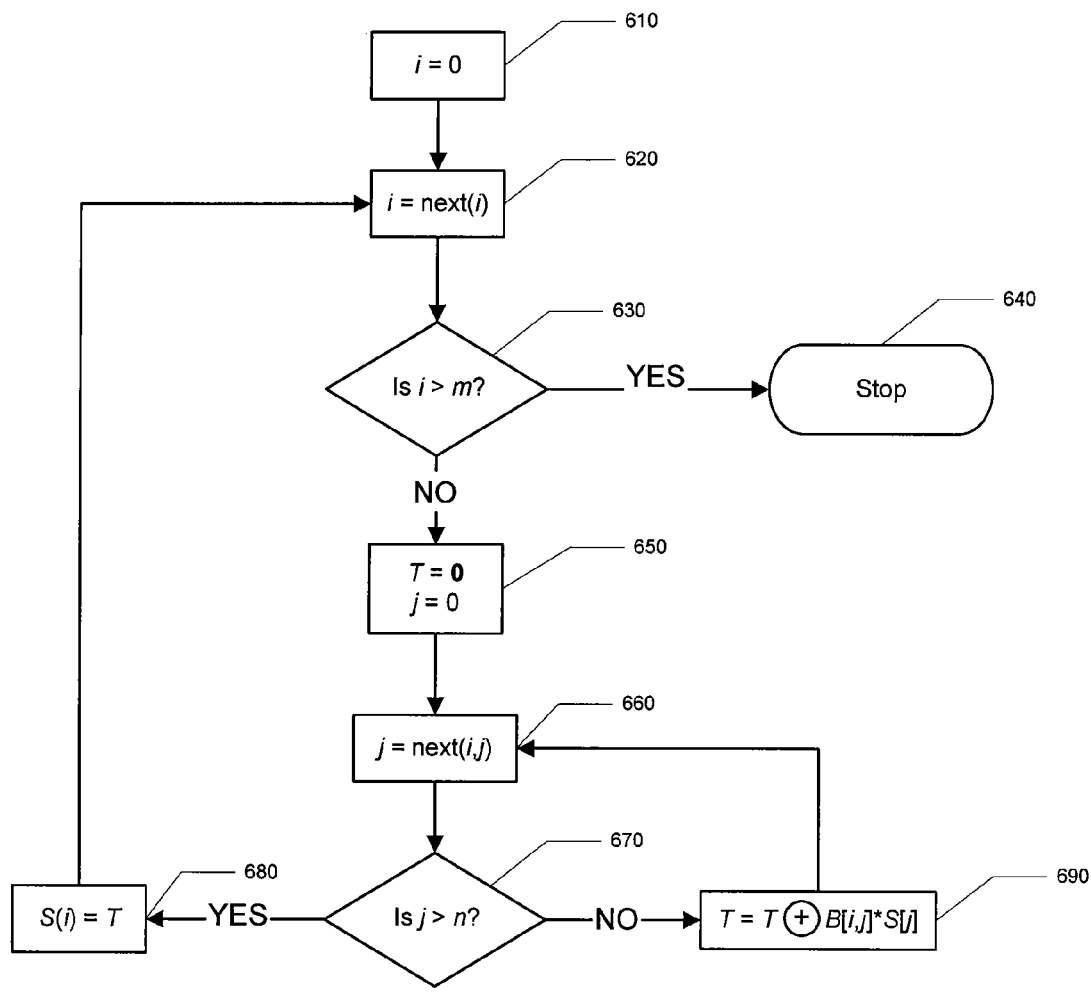
FIG. 6 is a flowchart of a transformation process according to an embodiment of the present invention.

From the description above and FIG. 6, it is clear that the number of symbols of storage needed in total to compute B↓S is n+1 symbols.

Let B be a matrix with format (m,n) and let S be a column vector of n symbols. Given B and S, define B↑S, the in-place linear matrix transformation of S by B in the upward direction, as follows:

For all $i=m, m-1, \ldots, 1$

Replace S[i] with the inner product of the i-th row of B and the current S.

A process that computes this in-place operation is explained with reference to FIG. 7. In Step 710 the integer variable i is initialized to m+1. In Step 720 the value of i is decreased to prev(i), where prev(i) is the largest integer<i such that row prev(i) of B has at least one non-zero entry, and prev(i) is set to zero if all rows before row i have all zero entries. In Step 730 it is checked whether or not i<1, and if i<1 then processing stops at Step 740, but if i≧1 then processing proceeds to Step 750 where a temporary symbol value T is set to zeroes and the integer variable j is set to zero. In Step 760 the value of j is increased to next(i,j), where next(i,j) is the smallest integer>j such that in row i of B, B[i,next(i,j)] is a non-zero entry, and next(i,j) is set to n+1 if all entries beyond B[i,j] row i are all zeroes. In Step 770 it is checked whether or not j>n, and if j>n then processing proceeds to Step 780 where symbol S[i] is set to T and then processing returns to Step 720.

If j≦n in Step 770 then processing proceeds to Step 790 where temporary symbol value T is reset to T⊕B[i,j]*S[j] and then processing returns to Step 760.

Figure 7:
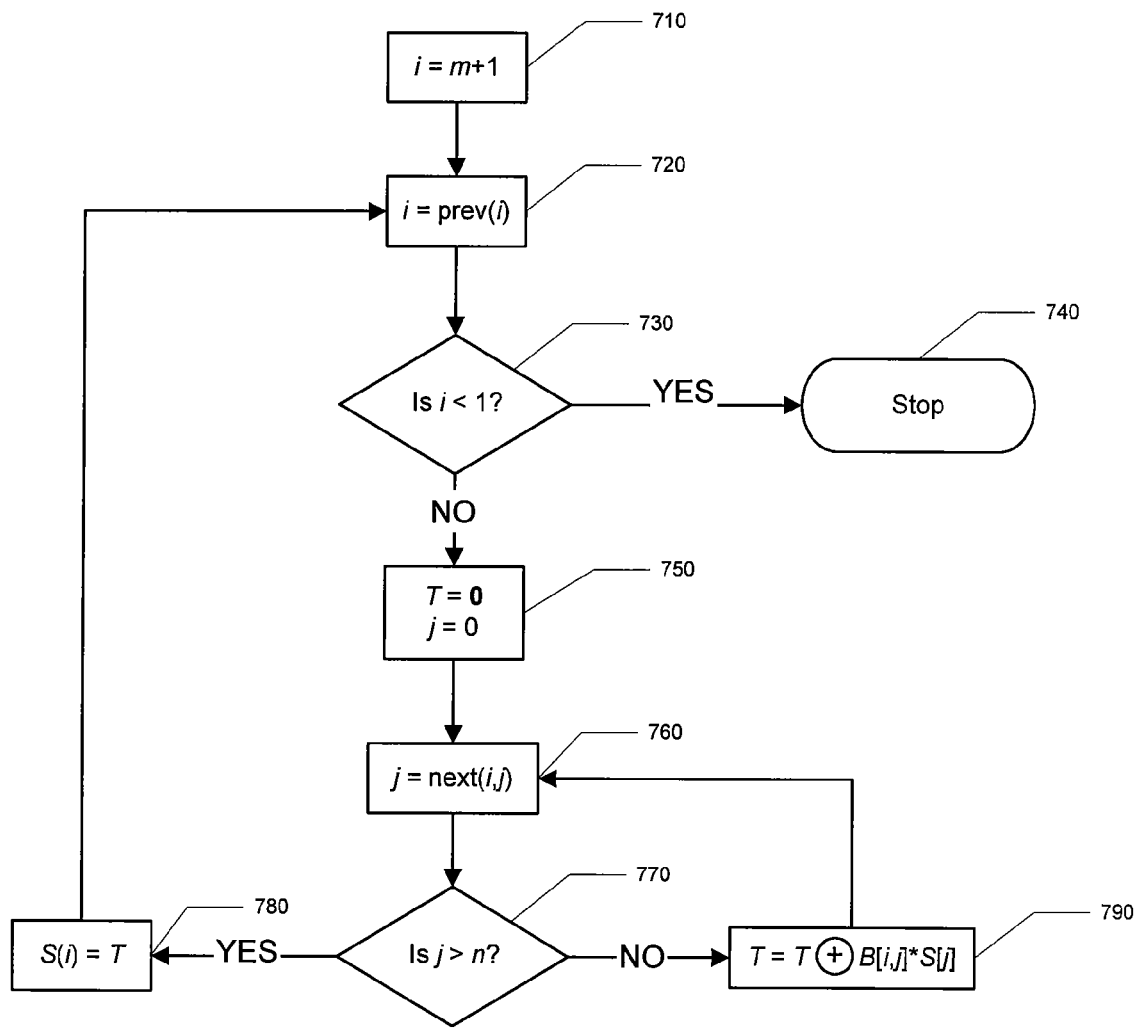
FIG. 7 is a flowchart of a method of in-place decoding of systematic Reed-Solomon codes.

From the description above and FIG. 7, it is clear that the number of symbols of storage needed in total to compute B↑S is n+1 symbols.

Let B be a matrix with format (n,n) such that for all i=1, . . . , n, B[i,i]≠0. The matrix B̃ is the matrix derived from B as follows:

$$\tilde{B}[i, j] = \begin{cases} B[i, i]^{-1} & \text{if } i = j \\ -B[i, j]*B[i, i]^{-1} & \text{if } i \neq j \end{cases}$$

Note that B̃ can be easily computed from B, and furthermore if B is a sparse matrix and can be accessed efficiently then B̃ is also a sparse matrix and can be accessed efficiently. Note also that if the entries of B are from GF(2), then B̃=B.

The ↑, ↓ and ~ operations just defined have the following properties: Let B be a matrix with format (n,n) such that for all i=1, . . . , n, B[i,i]≠0, and let S be a column vector of n symbols. Let $S^o$ denote the value of S before applying any of the transforms, i.e., initially $S=S^o$. Then:

$$\tilde{B}\downarrow(B\uparrow S)=S^o$$

$$B\uparrow(\tilde{B}\downarrow S)=S^o$$

$$B\downarrow(\tilde{B}\uparrow S)=S^o$$

$$\tilde{B}\uparrow(B\downarrow S)=S^o$$

Thus, for example B̃↓ and B↑ in-place operations are in the above sense inverses of one another. By symmetry, one can also define in-place operators of the form for example S↓B and S↑B̃ where S is a row vector of m symbols that have similar properties to those defined above, as one skilled in the art will recognize.

In-Place Transformations for Several Classes of Matrices

Processes are now described for the in-place calculation of linear transformations with special properties. These linear transformations are then used as building blocks to construct in-place processes for the calculation of more general linear transformations. In what follows, S denotes column vector of m symbols, B denotes matrix of format (m,n) over a field K, which for example can be regarded as an extension field of GF(2) (but the techniques apply equally well for general K), and at the end of the process, the storage for a vector of symbols S stores the result of the transformation B⊗S.

There are many techniques that can be used to also minimize the storage needed for B and for minimizing the overall computations needed to compute the operations, but generally this is less memory than is required for the data being transformed. For example, when B is a sparse matrix, a sparse representation of B is possible that also allows minimizing the overall computation needed to execute all the operations. When, for example, B is a sparse matrix, then there are more efficient ways of finding the next non-zero entry in a particular row or column of B than sequential search. These types of optimizations should be apparent to one of ordinary skill in the art after reading this disclosure, along with other optimizations that can be applied in conjunction with the techniques described herein.

2.1. Permutation Matrices.

In this case, B is a permutation matrix of format (n,n), i.e., it has exactly one nonzero entry in each row and each column and the nonzero entries are 1. Since this matrix is sparse, i.e., it has very few entries that are nonzero, in many applications it is desirable to represent it not as a matrix, but as a list (or another object that uses less memory than a matrix). For example, B could be represented as a list (B[1], ..., B[n]) wherein (j,B[j]) are the positions of the nonzero entries of B.

Figure 18:
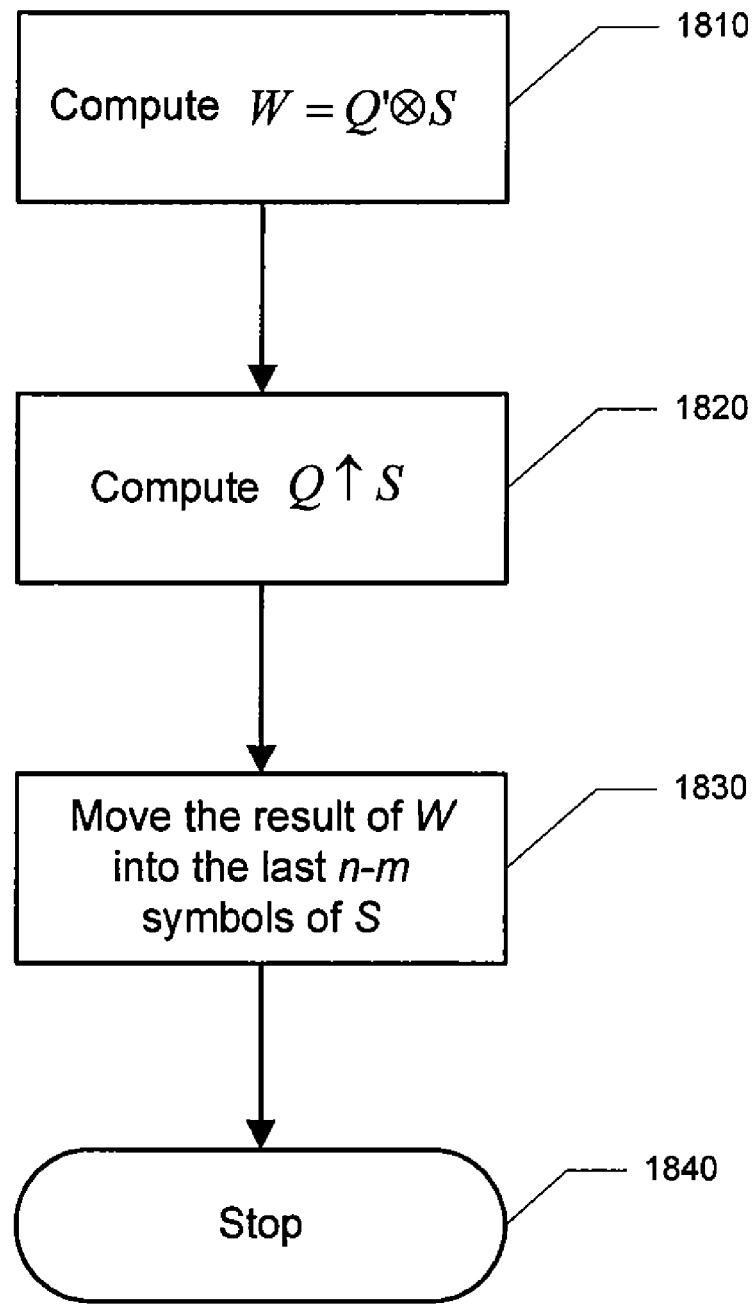
FIG. 18 is a flowchart of a method.

The process for the transformation of S with B is now described with reference to FIG. 18. A binary vector $v[1], \ldots, v[n]$ is maintained in which all components are originally initialized to 0. This process will use an additional symbol, denoted by T. Originally, the value of T is all zeroes.

In Step 805, a variable c is set to zero. This variable counts how many of the positions of the array corresponding to B have already been visited. In Step 810, the value of this variable is incremented by one, and in Step 815, it is checked whether the conditions c<n+1 and v[c]=1 are both satisfied. If so, then this means that position c of the array has already been visited, and there are still more positions to inspect. The process goes back to Step 810. If not, then either c=n+1, or v[c]=0. In the former case, all the positions have been visited, and the process finishes in Step 825. This test is performed in Step 820. If c is still less than n+1 in Step 820, then necessarily v[c]=0, i.e., position c has not yet been visited. In this case an auxiliary variable d is set to B[c] in Step 830. This value is equal to the position at which S[c] will be after the transformation. In Step 835, a test is made to see whether d is equal to c. If so, no further operation is necessary and processing jumps to Step 860. The value v[c] is set to 1, and the counter c is incremented by one in Step 860. If d is not equal to c in Step 835, then the values of T and S[c] are swapped in Step 840. Next, the values of T and S[d] are swapped in Step 845, v[d] is set equal to 1, and d is set to B[d]. In Step 850 it is checked to see if the value of d is equal to c, and if this is false then the loop comprising Steps 845 and 850 is repeated again. If d is equal to c, then processing jumps out of the loop and the values of T and S[c] are swapped in Step 855. In Step 860 the value of v[c] is set to 1, and the whole process now returns to Step 810, in which c is incremented by one. In effect, the process described decomposes the permutation given by the matrix B in cycles, and finds and processes the cycles one-by-one.

Figure 8:
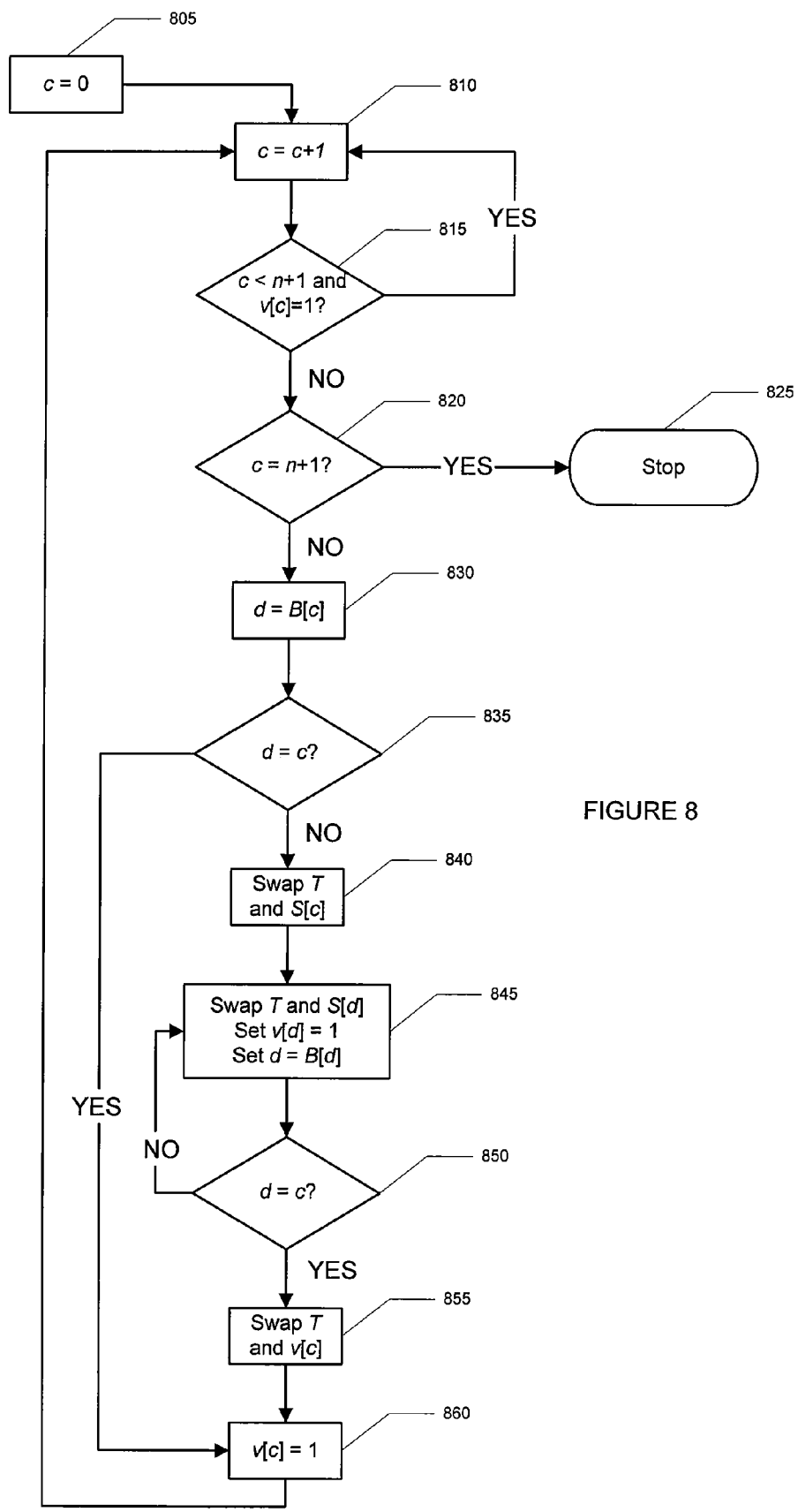
FIG. 8 is a flowchart further illustrating the method of in-place decoding of systematic Reed-Solomon codes.

In many cases, instead of moving the symbols of S around in memory to compute the in-place transformation of S with B, it is sufficient to keep track of the mapping of the logical ordering of the symbols of S to the actual positions of the symbols in S in memory without moving the symbols of S in memory. For example, one could maintain a mapping as follows: Let $p[1], \ldots, p[n]$ be the mapping from logical symbols of S to their actual position in memory, i.e., for all $i=1, \ldots, n$, p[i] is the position in memory of the i-th logical symbol in S. When this mapping is used, then in the transformation of S by the permutation matrix B, the process described above can be applied to $p[1], \ldots, p[n]$ to recompute the logical to memory mapping of S in place of applying it to $S[1], \ldots, S[n]$ as described above. Thus, the variable T used to describe the process in FIG. 8 is used to temporarily store a value of p[c] instead of a symbol S[c], and whatever logic is applied to the vector of symbols $S[1], \ldots, S[n]$ in FIG. 8 is instead applied to the vector $p[1], \ldots, p[n]$. This representation can be advantageous, because generally it is less costly in terms of CPU, memory bandwidth and other resources to move around in memory the typically much smaller entries of $p[1], \ldots, p[n]$ than the typically much larger symbol entries $S[1], \ldots, S[n]$.

Monomial Matrices

Figure 9:
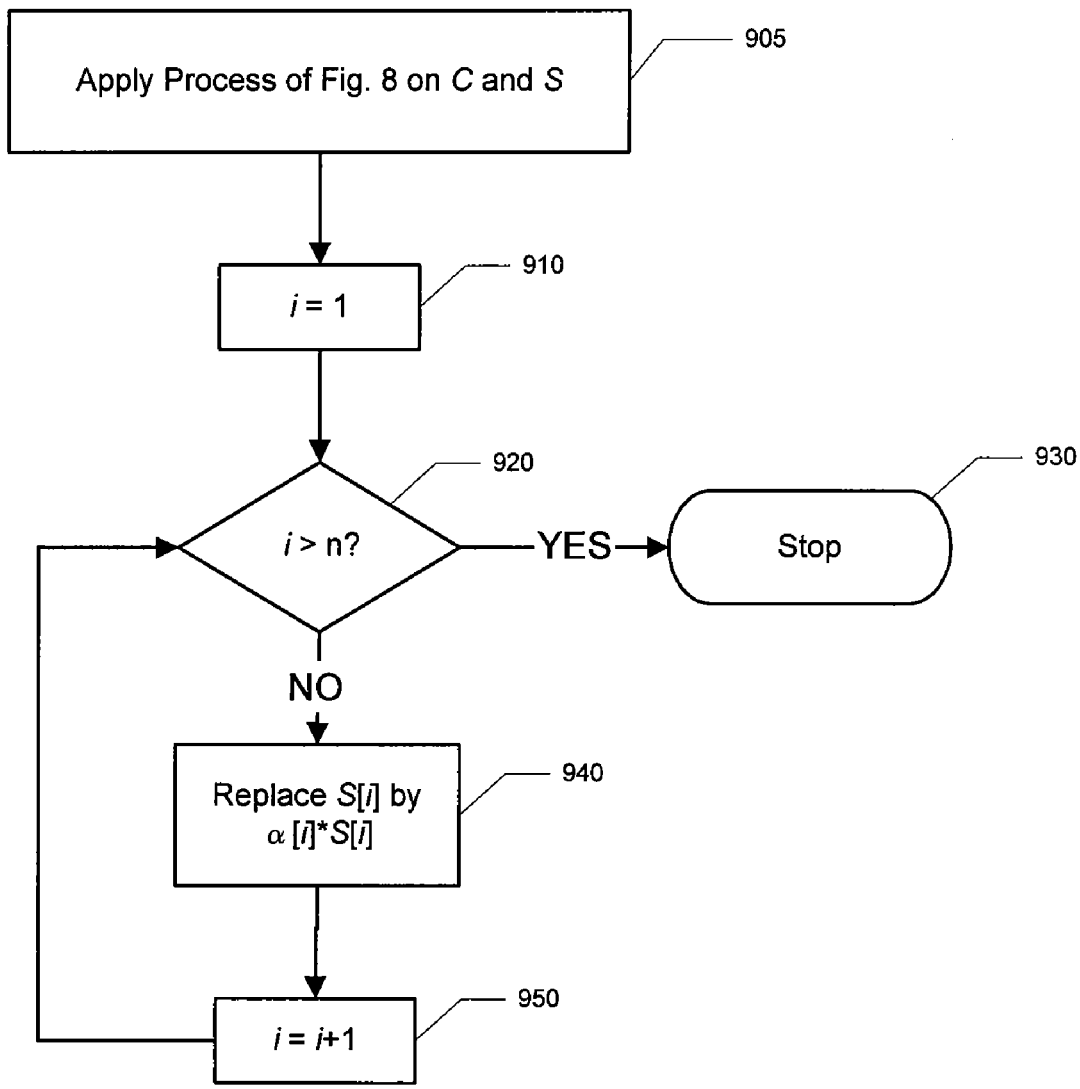
FIG. 9 is a flowchart of a method of vector calculation.

In this case, B is a matrix of format (n,n) with exactly one nonzero entry in every row and every column. A permutation matrix is a special case of a monomial matrix. A process to compute an in-place transformation for a monomial matrix is now described, with reference to FIG. 9. Such a matrix can be succinctly described by a list $(B[1], \ldots, B[n]; \alpha[1], \ldots, \alpha[n])$, wherein for all relevant values of j, B[j] is the position of the nonzero element in row j of B, and $\alpha[j]$ is the value of that nonzero position.

The process to calculate the in-place transformation pertaining to B uses the process for calculating a linear transformation pertaining to the permutation part of B as a subprocess. In Step 905 of FIG. 9, the process calculates $C \otimes S$ using the process described in FIG. 8, wherein C is the permutation matrix obtained from the matrix B by replacing the nonzero entries of B by 1. In Step 910, an integer variable i is initialized to zero, and then in Steps 920, 940 and 950 a loop is executed where in for each value of i between 1 and n the value of S[i] is replaced by the operation of $\alpha[i]$ on that position, i.e., by $\alpha[i]*S[i]$. When the loop is completed processing stops in Step 930. As is clear to those of skill in the art, the process described with reference to FIG. 9 calculates $B \otimes S$, since B can be written as a product of a diagonal matrix with diagonal entries $\alpha[1], \ldots, \alpha[n]$, and the matrix C. Furthermore, the storage used for symbols during the process is n+1.

Upper Triangular Matrices

Let U be a matrix of format (n,n) that is upper triangular (U[i,j]=0 for all j<i).

Then, $$U \downarrow S = U \otimes S,$$

i.e., the in-place operation $U \downarrow S$ results in the same n vector of symbols as the result of multiplying U by S. Furthermore, if U is also invertible ($U[i,i] \neq 0$ for all i) then $$\tilde{U} \uparrow S = U^{-1} \otimes S,$$

i.e., the in-place operation $\tilde{U} \uparrow S$ results in the same n vector of symbols as the result of multiplying the inverse of U by S. Thus, both matrix multiplication and matrix inverse multiplication can be accomplished using in-place operations for upper triangular matrices. Note that in the case that U is a sparse matrix then both $U \downarrow S$ and $\tilde{U} \uparrow S$ are sparse computations, i.e., both the multiplication by U and multiplication by the inverse of U can be accomplished by a sparse in-place computation, even though $U^{-1}$ is not necessarily a sparse matrix.

Lower Triangular Matrices

Let L be a matrix of format (n,n) that is lower triangular (L[i,j]=0 for all j>i).

Then, $$L \uparrow S = L \otimes S,$$

i.e., the in-place operation $L \uparrow S$ results in the same n vector of symbols as the result of multiplying L by S. Furthermore, if L is also invertible ($L[i,i] \neq 0$ for all i) then $$\tilde{L} \downarrow S = L^{-1} \otimes S,$$

i.e., the in-place operation $\tilde{L} \downarrow S$ results in the same n vector of symbols as the result of multiplying the inverse of L by S. Thus, both matrix multiplication and matrix inverse multiplication can be accomplished using in-place operations for lower triangular matrices. Note that in the case that L is a sparse matrix, then both L↑S and $\tilde{L}$↓S are sparse computations, i.e., both the multiplication by L and multiplication by the inverse of L can be accomplished by a sparse in-place computation, even though $L^{-1}$ is not necessarily a sparse matrix.

Products

In this case, B is a product of matrices of the types described above, i.e., B is a product $M_1 \cdot M_2 \cdot \ldots \cdot M_t$, where each $M_j$ is either a permutation matrix, or a monomial matrix, or an upper triangular matrix, or a lower triangular matrix. The process to calculate the transformation in-place for this matrix is to transform S with $M_t$, then transform the result with $M_{t-1}$, etc.

General Square Matrices

For a matrix B of format (n,n), it is possible to calculate a decomposition of B into a product of three matrices P, L, and U, wherein P is a permutation matrix, L is a lower triangular matrix with ones on the main diagonal, and U is an upper triangular matrix. Such a decomposition can be calculated by a variety of processes as is known to those of skill in the art. One of these processes is the well-known Gaussian elimination process. Then, the in-place transformation of S by B, i.e., computing B⊗S using an in-place transformation, is simply

P⊗(L↑(U↓S))

Figure 10:
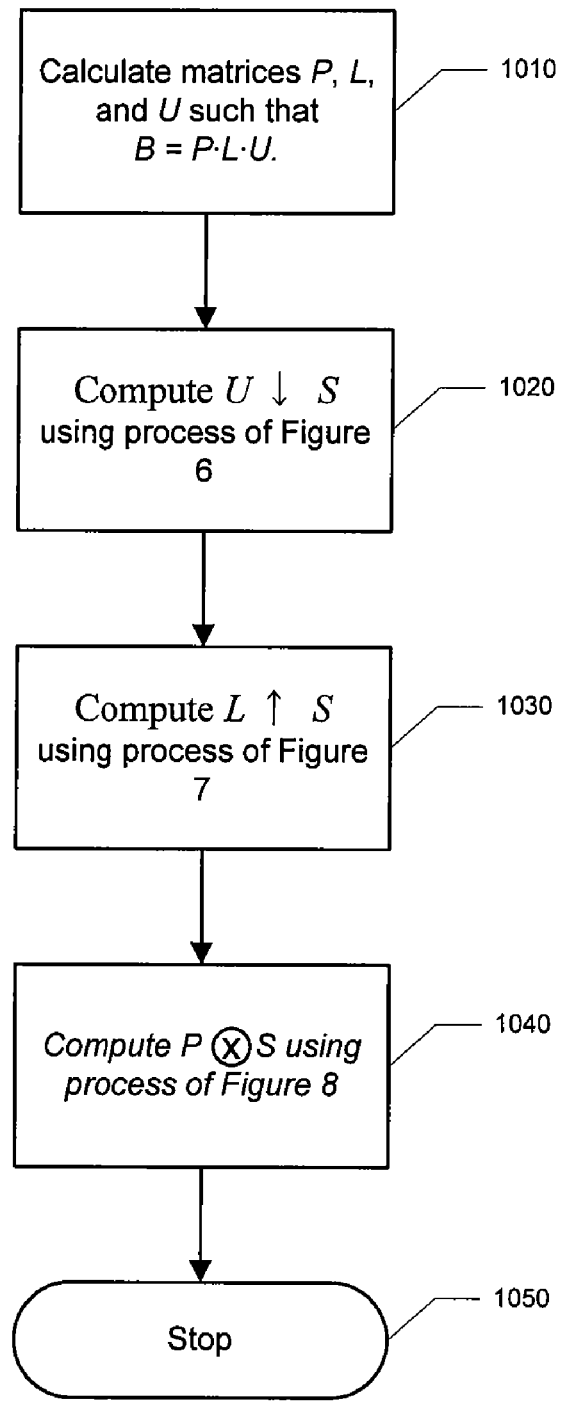
FIG. 10 is a flowchart of a method of vector calculation.

The process for computing this in-place transformation with an arbitrary square matrix B is now described in more detail with reference to FIG. 10. In Step 1010, a PLU-decomposition of B is calculated. As mentioned above, such a decomposition can be calculated by a variety of means. For general matrices, one possible method uses the Gaussian elimination algorithm. For special matrices, e.g., sparse matrices, Cauchy matrices, etc., more efficient methods can be employed, as is known to those of skill in the art. In Step 1020, the in-place transformation U↓S of the vector S of symbols is computed, as described with reference to FIG. 6. Next, in Step 1030 the transformed set of symbols S is transformed again, this time computing the in-place transformation L↑S, as described with reference to FIG. 7. Next, in Step 1040 the new transformed set of symbols S is transformed again, computing the in-place transformation of S by permutation matrix P, described with reference to FIG. 8.

Note that if B is invertible then the following process computes $B^{-1}$⊗S as an in-place transformation:

$\tilde{U}$↑($\tilde{L}$↓($P^{-1}$⊗S)), where $P^{-1}$ is the permutation matrix that is the inverse of P.

Note that the amount of computing needed to compute $B^{-1}$⊗S using the in-place transformation processes described above is essentially the same as for B⊗S. Furthermore, if both U and L are represented sparsely and for example have only a linear in n number of non-zero entries then both B⊗S and $B^{-1}$⊗S can be computed as described using the in-place transformations described above in linear time. The amount of memory or storage used during the computation of the in-place transformations described above for storing symbols at any point in the computation is n+1.

It should be noted that the process described here is very general, but may not be the most efficient one in all cases of interest. Other cases are described below in which the in-place transformation can be accomplished more efficiently than in this general case.

Non-Square Matrices

If a matrix B of format (m,n) is not a square matrix, then methods similar to the ones described above can be utilized to calculate the transformations in such a way as to minimize the amount of memory. For example, when the matrix has more rows than columns (i.e., m is larger than n), then it is only important to calculate the first n elements of the result vector in-place. This can be accomplished as follows.

Let B' identify the square matrix formed by the first n rows of B, and let B" identify the matrix formed by the last m-n rows of B. Let S be a column vector of n symbols that initially holds the symbol values to be transformed, and let S' identify a column vector of an additional m-n symbols. Then, B⊗S can be computed in-place as follows:

S' is computed as B"⊗S using a straightforward matrix multiplication such as the "simple transformation process" described in the section above titled "Linear Operators".

Compute P, L, U such that B'=P·L·U, where P is a permutation matrix, L is a lower triangular matrix and U is an upper triangular matrix.

Compute the in-place transformation P⊗(L↑(U↓S)).

Note that if the matrix B' is lower triangular than the last two steps of the above process is simplified to computing B'↑S, whereas if the matrix B' is upper triangular than the last two steps of the above process is simplified to computing B'↓S.

Similarly, if n is larger than m, then a similar method can be used to calculate the transformation in such a way that it replaces the first m entries of the vector S as follows. Let B' identify the square matrix formed by the first m columns of B, and let B" identify the matrix formed by the last n-m columns of B. Let S be a column vector of n symbols that initially holds the symbol values to be transformed, and let S' identify the first m symbols of S and let S" identify the last n-m symbols of S. Then, B⊗S can be computed in-place as follows:

Compute P, L, U such that B'=P·L·U, where P is a permutation matrix, L is a lower triangular matrix and U is an upper triangular matrix.

Compute the in-place transformation P⊗(L↑(U↓S')).

S' is updated to be the result of B"⊗S"⊕S' using a small variant of a straightforward matrix multiplication such as the "simple transformation process" described in the section above titled "Linear Operators".

Note that if the matrix B' is lower triangular than the first two steps of the above process is simplified to computing B'↑S', whereas if the matrix B' is upper triangular than the first two steps of the above process is simplified to computing B'↓S'.

Efficient In-Place Linear Transformations for Almost Sparse Matrices

Figure 11:
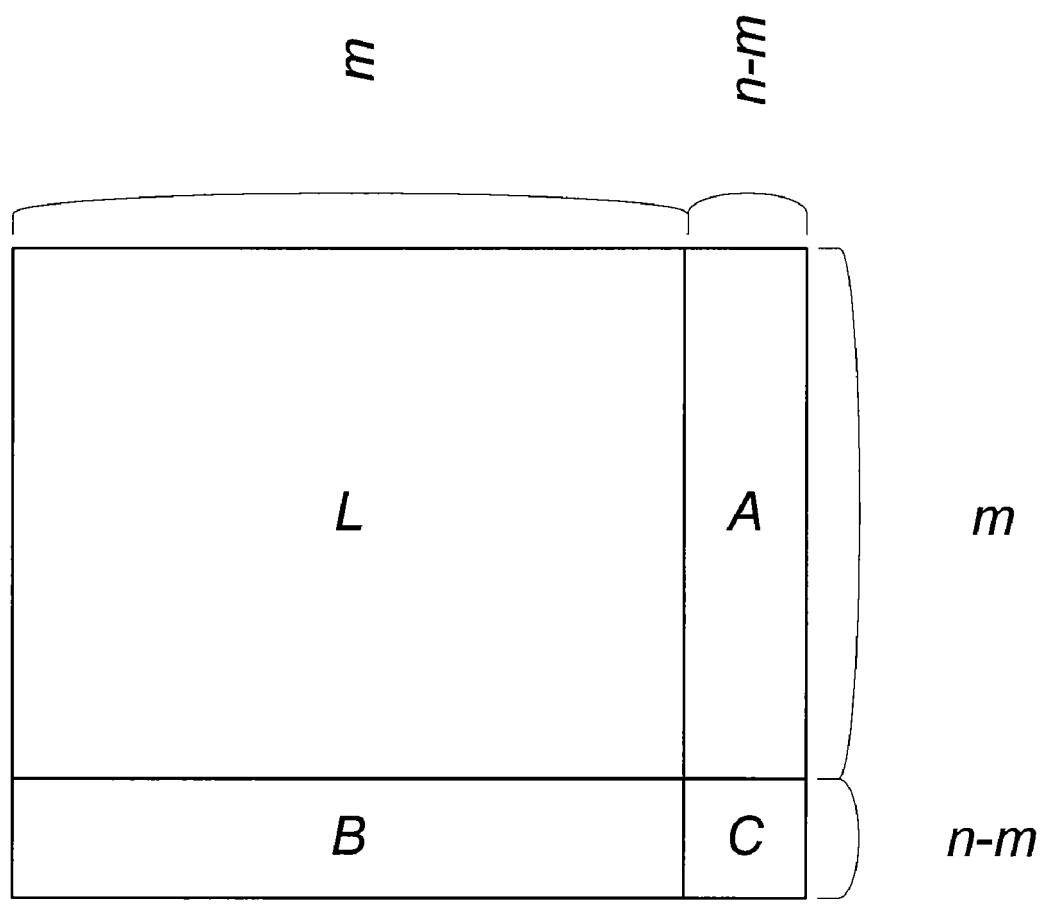
FIG. 11 illustrates a matrix usable for decoding.

Let M be a square matrix of format (n,n) of the type shown in FIG. 11. In FIG. 11, m≤n, L is a lower triangular invertible matrix of format (m,m), A is a matrix of format (m,n-m), B is a matrix of format (n-m,m) and C is an invertible matrix of format (n-m,n-m).

Let S be a column vector of n symbols. Below we describe efficient in-place transformations that compute M⊗S and $M^{-1}$⊗S. These in-place transformations lay the foundation for some of the FEC encoding and FEC decoding methods and processes described later that are both efficient and in-place. For some of these FEC codes where a matrix of type M is considered, M is a sparse matrix, e.g., the number of non-zero entries in M is of the order of n, and n-m is small compared to n, e.g., n-m is of the order of square root of n. For this example, the computation needed to perform the in-place transformations described below that compute M⊗S and M$^{-1}$⊗S is of the order of n symbol operations, whereas the total space or memory used for symbols during the computation is at most n+1.

Figure 12:
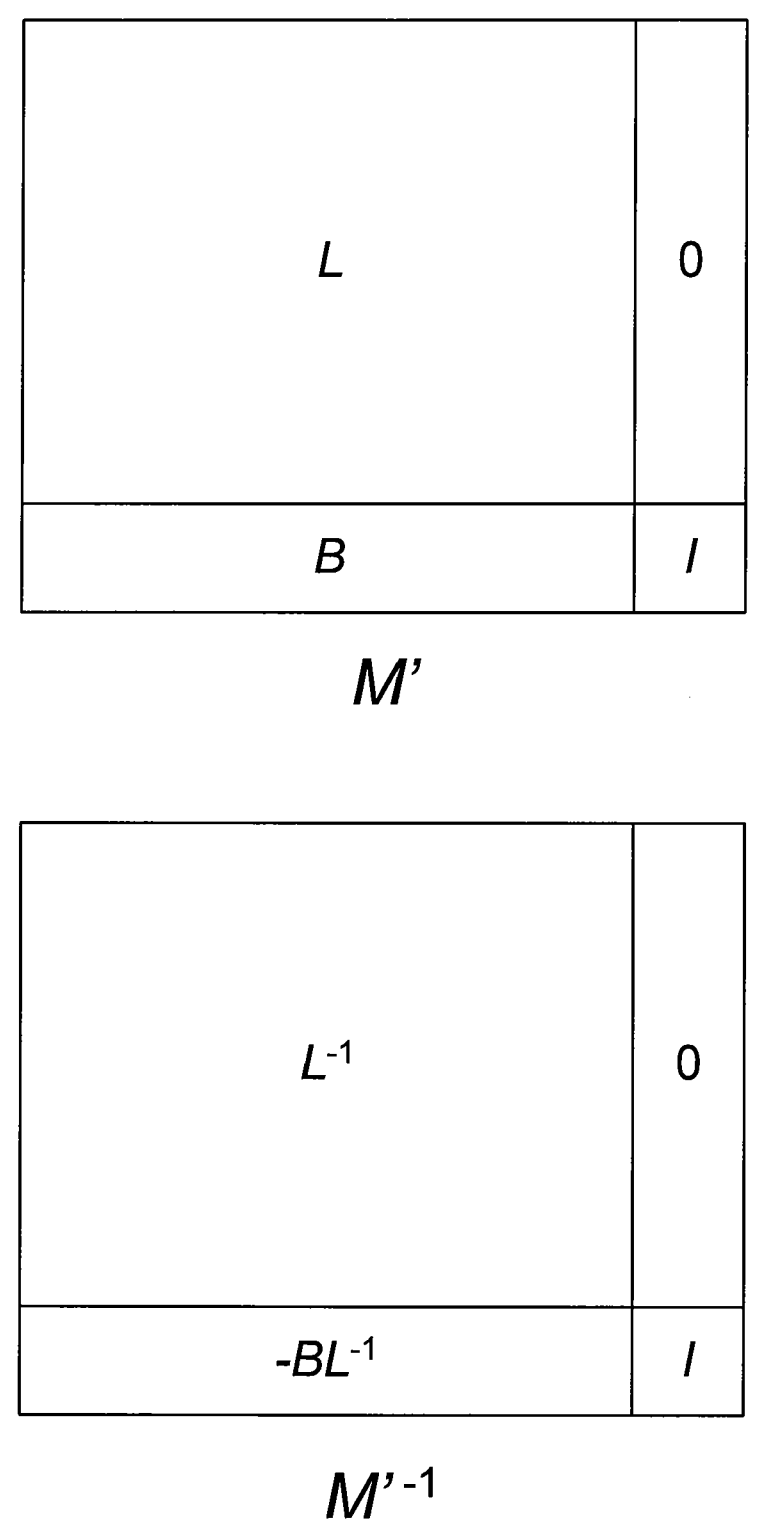

Let M' be the square matrix of format (n,n) derived from M as shown in FIG. 12. In FIG. 12, L and B are the same matrices as L and B shown in FIG. 11, all entries of the matrix formed by the last n-m columns and the first m rows are zeroes, and the matrix formed by the last n-m columns and the last n-m rows is the identity matrix. Note that M' is an invertible lower triangular matrix. FIG. 12 also shows the form of M'$^{-1}$, the inverse matrix of M'.

Figures 13A, 13B:
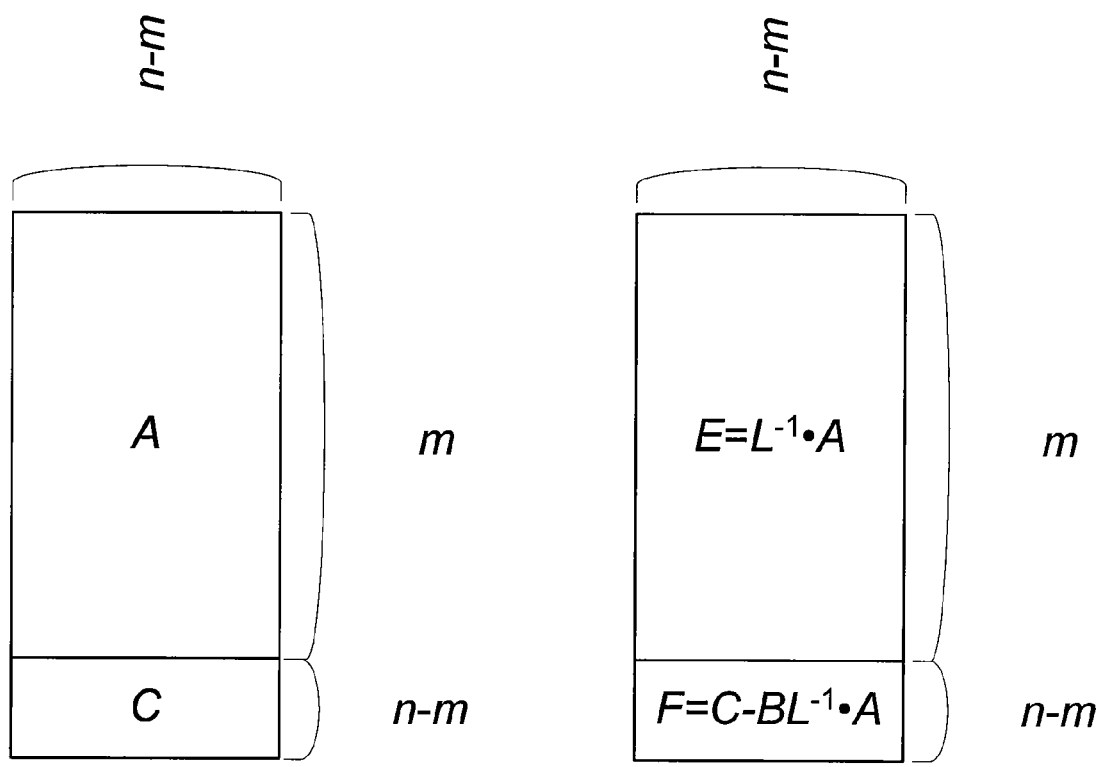
FIG. 13 illustrates data structures usable for processing.

Let D be the matrix of format (n,n-m) shown in FIG. 13A. In FIG. 13A, A and C are the same matrices A and C as shown in FIG. 11. The matrix D can also be viewed as a column vector of n symbols, where each symbol is the concatenation of n-m field elements from the underlying field K. Thus, one can define the operation of a matrix of format (n,n) on D when D is viewed as a column vector of n symbols as just described, where the operation of the matrix on D viewed as a vector of n symbols is the same as the matrix multiplication of the matrix and D when viewed as a matrix.

Viewing D as a column vector of n symbols as just described, it can be seen that the in-place transformation M̃'↓D results in D having the values as shown in FIG. 13B, where when E is viewed as a matrix of format (m,n-m), E=L$^{-1}$·A and when F is viewed as a matrix of format (n-m, n-m), F=C−B·L$^{-1}$·A. Because C and L are both invertible, it can be easily verified that F is also invertible. Let P, Λ and Y be matrices of format (n-m,n-m) where F=P·Λ·Y, P is a permutation matrix, Λ is a lower triangular matrix and Y is an upper triangular matrix. This factorization can be obtained for example using well-known Gaussian elimination or similar techniques.

Figure 14:
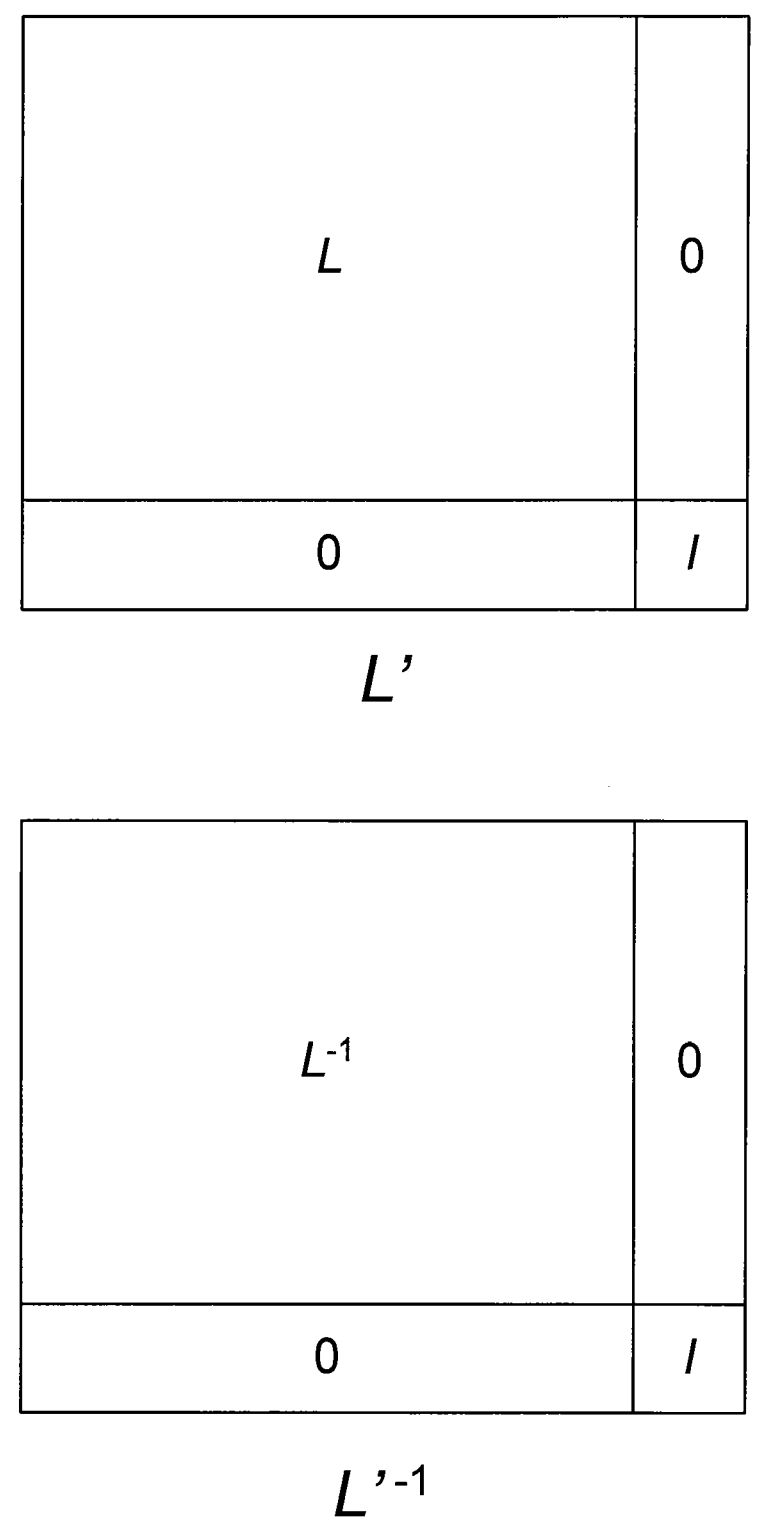

Let L' be a square matrix of format (n,n) as shown in FIG. 14. In FIG. 14, L is the same matrix as the matrix L shown in FIG. 11, all entries of the matrix formed by the last n-m columns and the first m rows are zeroes, all entries of the matrix formed by the last n-m rows and the first m columns are zeroes, and the matrix formed by the last n-m columns and the last n-m rows is the identity matrix. Note that L' is an invertible lower triangular matrix. FIG. 14 also shows the form of L'$^{-1}$, the inverse matrix of L'.

Figure 15A:
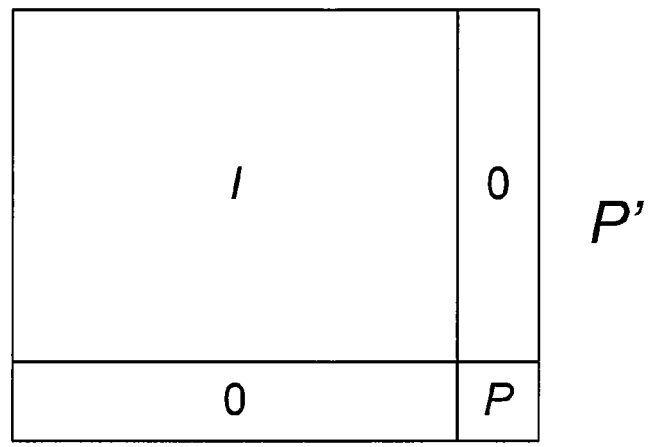
FIG. 15 illustrates a matrix and transformations thereof.
Figure 15B:
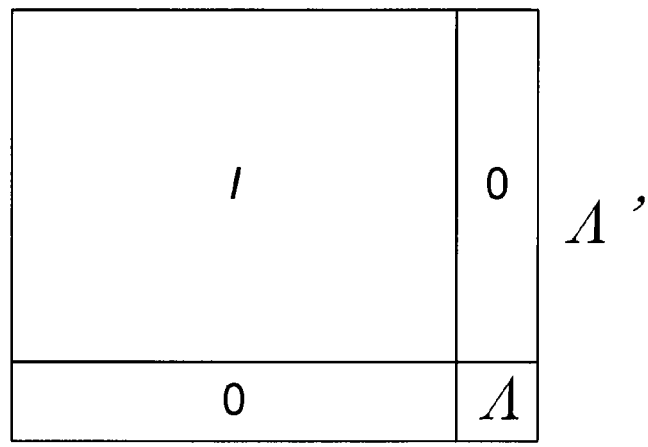
Figure 15C:
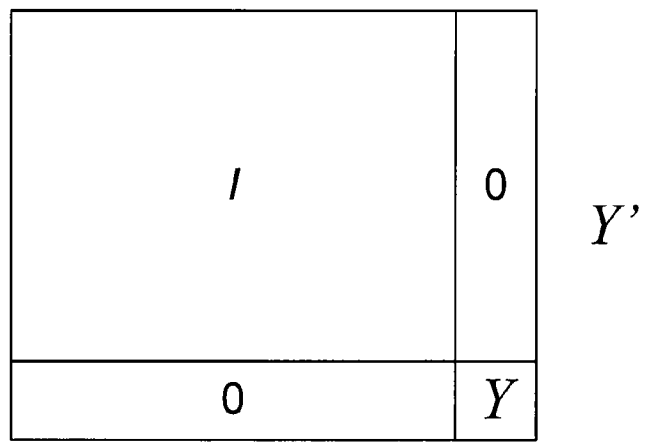

Let P', Λ' and Y' be a square matrices of format (n-m, m) as shown in FIGS. 15A, 15B and 15C, respectively. P, Λ, and Y are the matrices such that F=P·Λ·Y and F is as described above, and in each of P', Λ' and Y' all entries of the matrix formed by the last n-m columns and the first m rows are zeroes, all entries of the matrix formed by the last n-m rows and the first m columns are zeroes, and all entries of the matrix formed by the first m rows and the first m columns is the identity matrix. Note that P', Λ' and Y' are invertible matrices.

Figure 16:
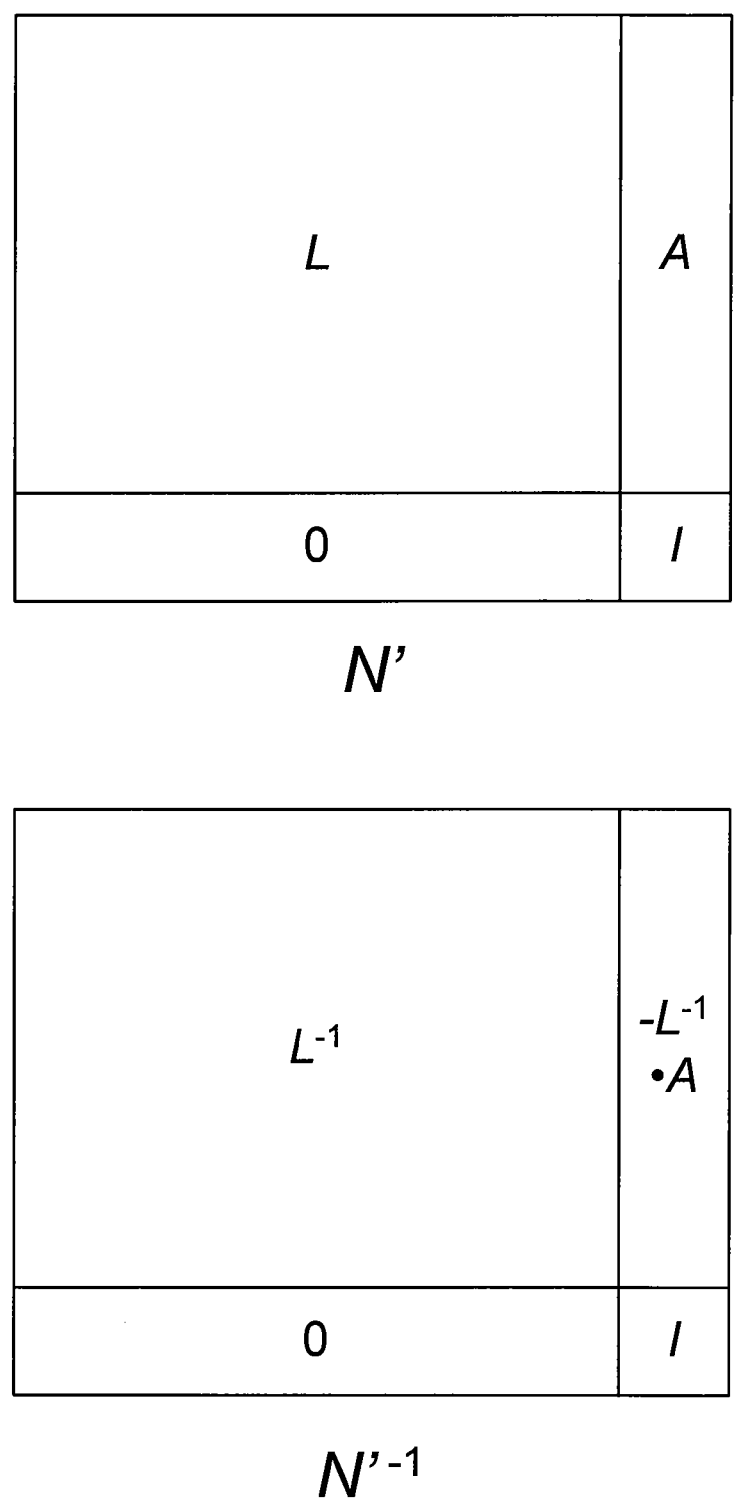

Let N' be a square matrix of format (n,n) as shown in FIG. 16. In FIG. 16, L and A are the same matrices L and A as shown in FIG. 11, all entries of the matrix formed by the last n-m rows and the first m columns are zeroes, and the matrix formed by the last n-m columns and the last n-m rows is the identity matrix. Note that N' is an invertible matrix, and although it is not literally lower triangular, it can be seen that N'↑S computes in-place the result of N'⊗S. FIG. 16 also shows the form of N'$^{-1}$, the inverse matrix of N'. It can also be verified that Ñ'↓S computes in-place the result of N'$^{-1}$⊗S.

Based on the notation introduced above, a process that computes the in-place transformation M⊗S on input M and S is described with reference to FIG. 17. In Step 1710, the in-place transformation N'↑S is computed. In Step 1720, the in-place transformation M̃'↓D is computed, where D is as described above, and then as described above the matrix F=C−B·L$^{-1}$·A is the last n-m rows of the result of the transformation. In Step 1730, the matrix F is factored into P, Λ, and Y as described above. In Step 1740, the in-place transformation Y'↓S is computed. In Step 1750, the in-place transformation Λ'↑S is computed. In Step 1760, the in-place transformation P⊗S is computed. In Step 1770, the in-place transformation L̃'↓S is computed. In Step 1780, the in-place transformation M'↑S is computed. In Step 1790 the process stops as the in-place transformation is completed.

Figure 17:
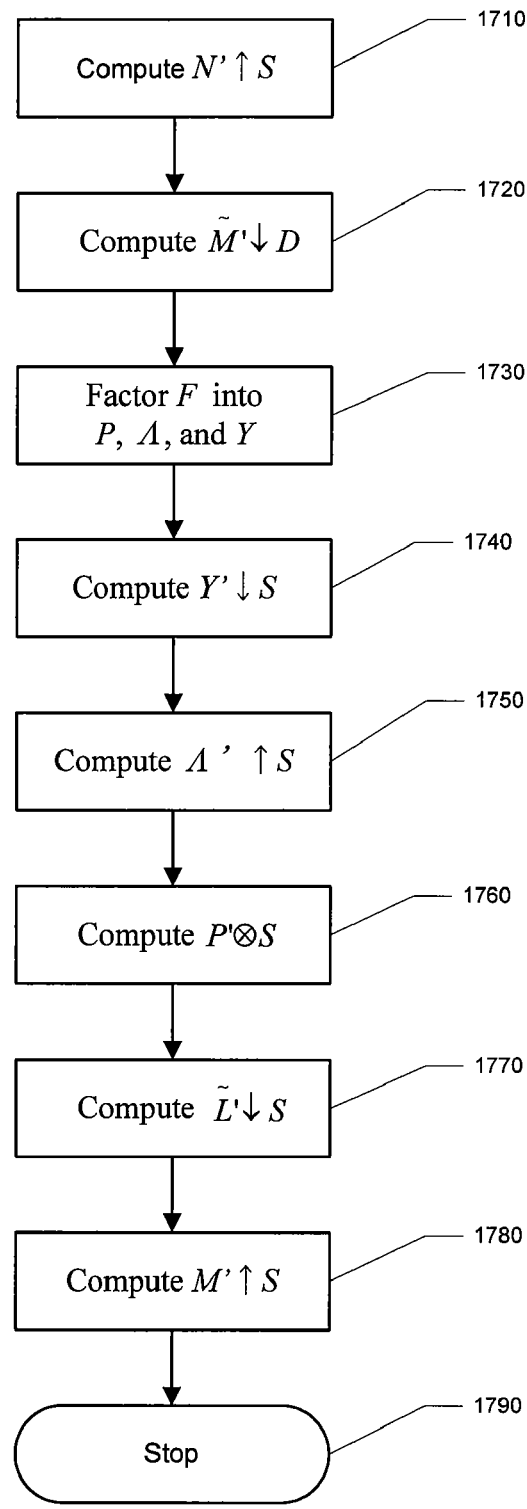
FIG. 17 is a flowchart of a method.

It can be verified that at the end of the process described in FIG. 17 the vector S stores the result of M multiplied by the original vector S. Note that the storage used for symbols at any point in this process is at most n+1, and that the number of symbol operations aggregated over all the steps is linear in the sum of the number of non-zero entries in M and (n-m)$^2$.

Figure 20:
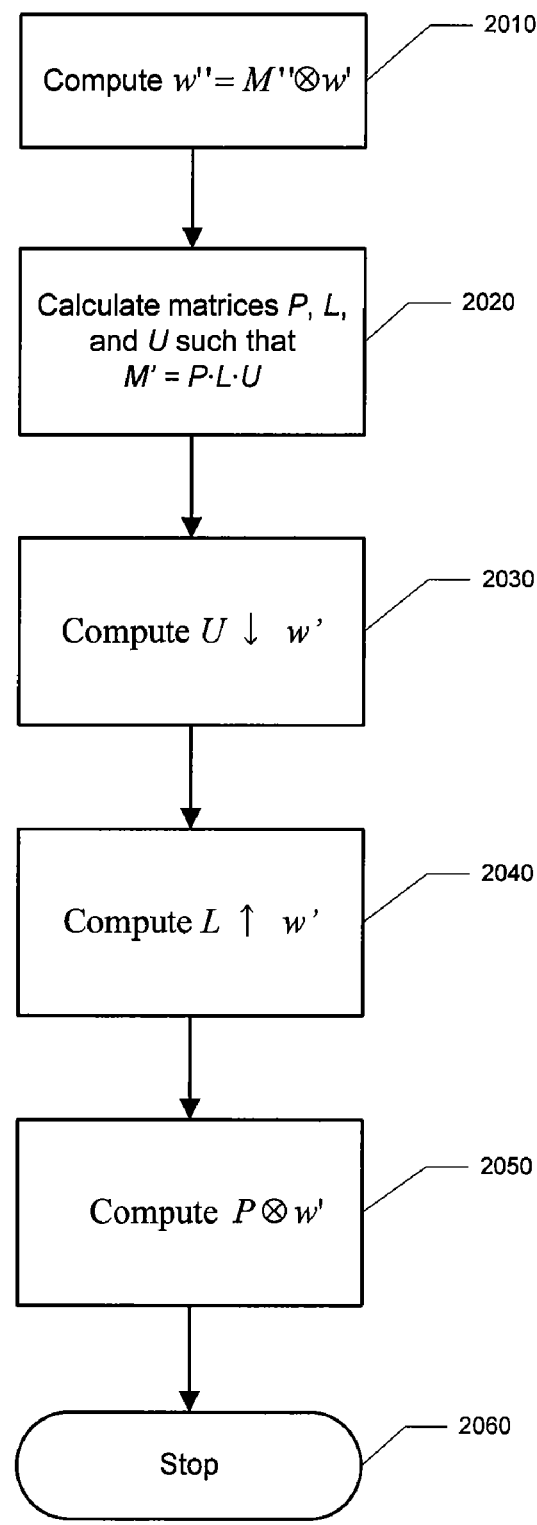
FIG. 20 is a flowchart of a method.
Figure 21:
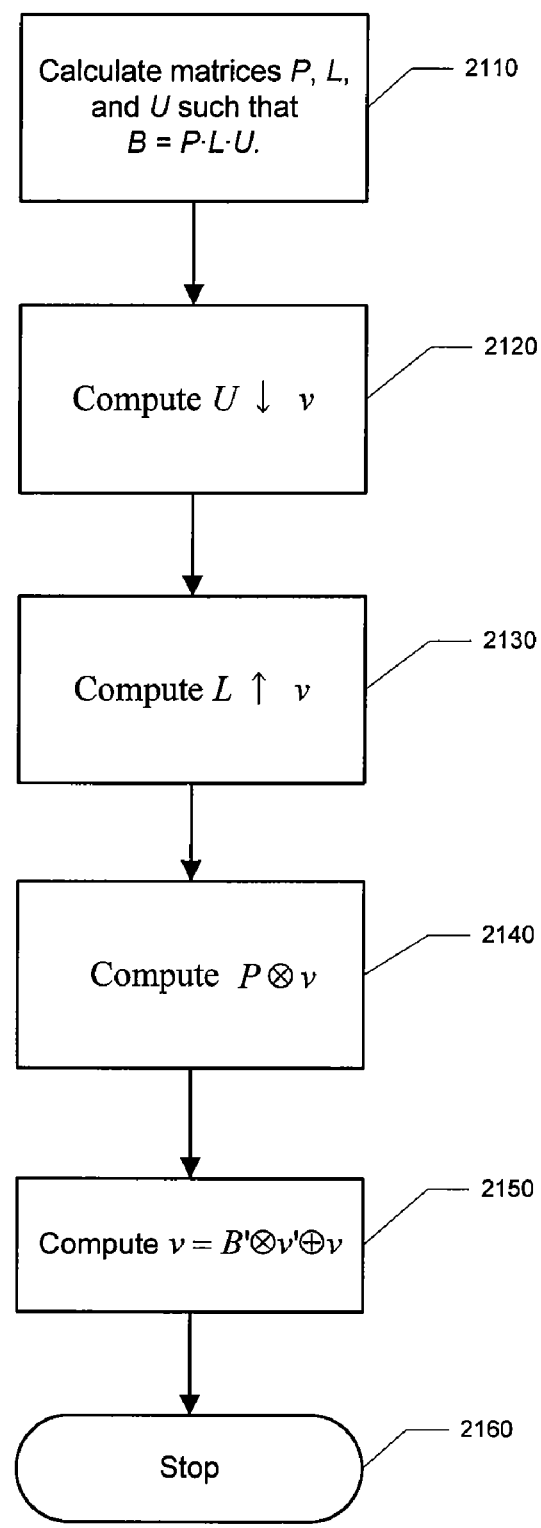
FIG. 21 is a flowchart of a method.

There are many variations on the process described in FIG. 17 that can lead to further efficiencies and advantages. For example, during the in-place operations, the portions of the operations that operate on an identity submatrix can be skipped, since these operations do not change the result, i.e., when computing N'↑S one can skip operating with the last n-m rows of N' since these operations do not affect the result of this in-place transformation. As an example of another variation, one can reorder some of the steps without affecting the result. One such variant is to perform Step 1770 between Step 1730 and Step 1740. Another such variant is to perform Step 1770 between Step 1740 and Step 1750, in which case it is possible to combine Steps 1740 and 1770 into one in-place transformation as shown in FIG. 20, and to combine Steps 1750 and 1760 into one in-place transformation as shown in FIG. 21. As another example of a variant, Steps 1730, 1740, 1750 and 1760 can be replaced with the steps of multiplying F by the column vector comprising the last n-m symbols of S and replacing the last n-m symbols of S by the result. The multiplication by F may be for example performed using either in-place transformations as described in this disclosure or standard techniques such as standard matrix multiplication.

Based on the notation introduced above, another variant of a process that computes the in-place transformation M⊗S on input M and S is described with reference to FIG. 18. The in-place transformation described with reference to FIG. 18 uses a total of n+(n-m)+1 symbols of storage, i.e., n-m more symbols than the process described with reference to FIG. 17, with the benefit that the total number of symbol operations is the same as would be used in a straightforward non-in-place calculation of M⊗S. Thus, when M is sparse, the process described below with reference to FIG. 18 may take less computation than the process described with reference to FIG. 17, at the expense of slightly more symbol storage. In applications to FEC codes described later, n-m is often small compared to n, and thus the extra amount of symbol storage required for the process described with reference to FIG. 18 is typically small compared to the minimal amount of symbol storage achieved by the process described with reference to FIG. 17.

Let W be a column vector of an additional n-m symbols. Let Q identify the matrix of format (m,n) that comprises the first m rows of M, and let Q' identify the matrix of format (n-m,n) that comprises the last n-m rows of M. In Step 1810 of FIG. 18, W=Q'⊗S is computed using straightforward matrix multiplication. In Step 1820, the in-place transformation Q↑S is computed. Note that because the first m columns of Q form the lower triangular matrix L, the in-place transformation computed in Step 1820 results in the first m entries of S being equal to $Q \otimes S$. In Step 1830, W is copied into the last n-m symbols of S. In Step 1840 the process stops as the in-place transformation is completed.

Based on the notation introduced above, a process that computes the in-place transformation $M^{-1} \otimes S$ on input M and S is described with reference to FIG. 19. In Step 1910, the in-place transformation $\tilde{M}' \downarrow S$ is computed. In Step 1920, the in-place transformation $L' \uparrow S$ is computed. In Step 1930, the in-place transformation $\tilde{M} \downarrow D$ is computed, where D is as described above, and then as described above the matrix $F=C-B \cdot L^{-1} \cdot A$ is the last n-m rows of the result of the transformation. In Step 1940, the matrix F is factored into P, $\Lambda$, and Y as described above. In Step 1950, the in-place transformation $P'^{-1} \otimes S$ is computed. In Step 1960, the in-place transformation $\tilde{\Lambda}' \downarrow S$ is computed. In Step 1970, the in-place transformation $\tilde{Y}'' \uparrow S$ is computed. In Step 1980, the in-place transformation $\tilde{N}' \downarrow S$ is computed. In Step 1990 the process stops as the in-place transformation is completed.

Figure 19:
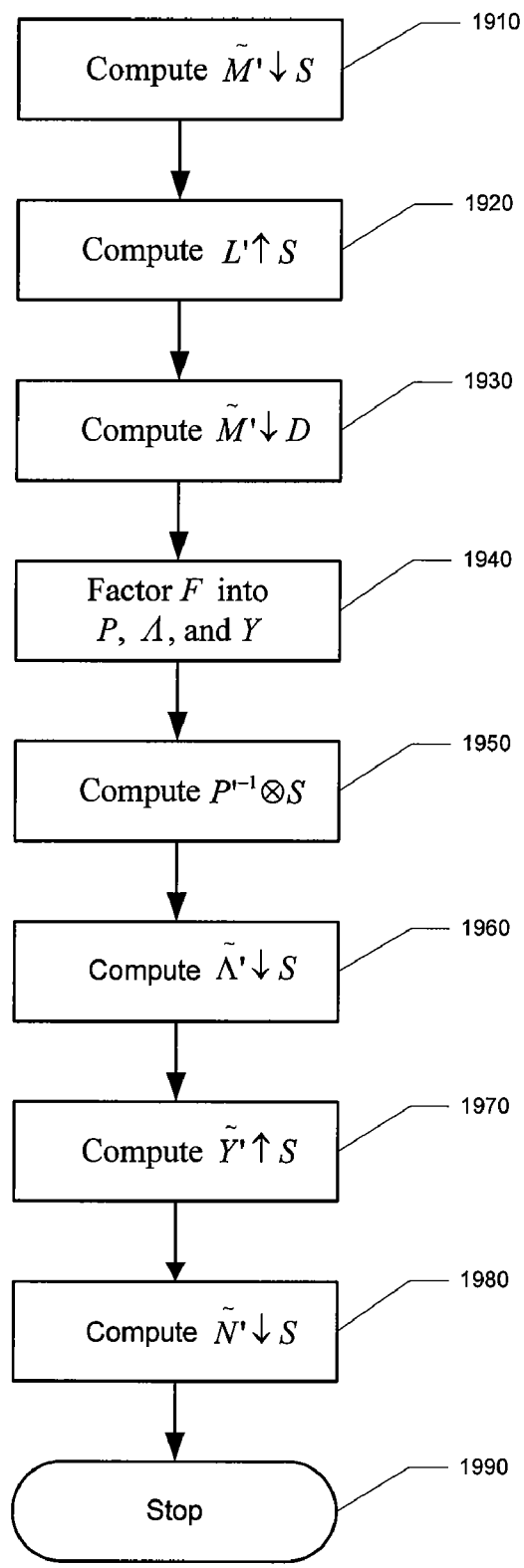
FIG. 19 is a flowchart of a method.

It can be verified that at the end of the process described in FIG. 19 the vector S stores the result of $M^{-1}$ multiplied by the original vector S. Note that the storage used for symbols at any point in this process is at most n+1, and that the number of symbol operations aggregated over all the steps is linear in the sum of the number of non-zero entries in M and $(n-M)^2$.

This process described above with reference to FIG. 19 essentially is the reverse of the process described above with reference to FIG. 17. As was the case with the process described with reference to FIG. 17, there are many variations of the process described in FIG. 19 that can lead to further efficiencies and advantages. For example, Steps 1940, 1950, 1960 and 1970 can be replaced with the steps of determining $F^{-1}$ and then multiplying $F^{-1}$ by the column vector comprising the last n-m symbols of S and replacing the last n-m symbols of S by the result. The determination of and multiplication by $F^{-1}$ may be for example performed using either in-place transformations as described in this disclosure or standard techniques such as standard Gaussian elimination and matrix multiplication. In the case of using standard matrix multiplication for this step, more storage for symbols may be required, for example an additional n-m symbols of storage so that for example the maximum storage for symbols during the in-place transformation is 2·n-m+1 symbols, but still the overall amount of storage used for symbols during the entire in-place transformation is substantially less than 2·n that standard techniques would use, especially when m is close to n.

Applications

Reed-Solomon Codes

A class of linear codes for protection of transmission in case of erasures, or corruptions, are known as Reed-Solomon codes. There are a number of equivalent ways to describe these codes, such as cyclic codes, codes based on Vandermonde matrices, codes based on Cauchy matrices, or the like. In all these cases, the encoding process can be described by multiplication of a vector of symbols with a matrix. Where the number of source symbols is k, the number of output symbols is n, v denotes the column vector of k symbols to be encoded, and w denotes the column vector of n symbols containing the encoding of v, the encoding process is described as $$M \otimes v = w,$$

wherein M is a matrix of format (n,k), which is sometimes also called a generator matrix for the code. Let M' identify the matrix of format (k,k) that comprises the first k rows of M, and let M" identify the matrix of format (r,k) that comprises the last r=n-k rows of M. Let w' identify the first k symbols in w and let w" identify the last r symbols in w.

Where the code is systematic, i.e., where after the matrix multiplication of v by M the first k symbols of the result w' coincide with the entries of v, M' is the identity matrix. In a systematic code, the entries of an encoded vector w' are referred to as the source positions. In such a case, M" is used for calculating the r redundant symbols w". The matrix M can be represented in a variety of ways. For example, where a non-systematic version is desired, M could be a Vandermonde matrix. In the systematic case, M" could form a Cauchy matrix. These representations are mentioned only for exemplary purposes, and by no means form an exhaustive list.

When the Reed-Solomon code is non-systematic, the process described with reference to FIG. 20 describes an in-place transformation that produces the encoding using storage for at most n+1 symbols during the process. Initially w' stores the k source symbols to be encoded. At the end of the process, w stores the result of the encoding, i.e., w' stores the first k encoding symbols and w" stores the remaining r encoding symbols generated. In Step 2010 of FIG. 20, w" is computed as $M'' \otimes w'$ using a straightforward matrix multiplication, for example using the "simple transformation process" described previously. In Step 2020, M' is factored into P, L, and U, where each of these matrices is of format (k,k), and where P is a permutation matrix, L is a lower triangular matrix and U is an upper triangular matrix, and thus $M'=P \cdot L \cdot U$. Such a decomposition can be calculated with a variety of approaches, for example, using the Gaussian elimination algorithm, or, when the matrix M' is a Cauchy matrix, then this PLU-decomposition can be calculated with a formula, thereby reducing the computational complexity of the computation. In Step 2030, the in-place transformation $U \downarrow w'$ is computed. In Step 2040, the in-place transformation $L \uparrow w'$ is computed. In Step 2050, the in-place transformation $P \otimes w'$ is computed. In Step 2060 the processing stops because the in-place transformation is complete. It should be noted that the order in which encoding symbols are sent in any given system need not be the order in which they are stored and so it may not be necessary to actually perform the last step 2060.

When the Reed-Solomon code is systematic, an in-place transformation that produces the r redundant symbols from the k source symbols using symbol storage for at most m+1 symbols during the process is now described, where m is the maximum of k and r. In this case, the source symbols initially stored in w' are either entirely or partially overwritten by the generated redundant symbols, and thus the overwritten source symbols generally would be saved in another storage space controlled by the application using the FEC encoder or they would be already sent and no longer need to be stored. When the number r of redundant symbols is greater than or equal to the number k of source symbols then a slight variant of the process described in FIG. 20 can be used to generate the redundant symbols using an in-place transformation that computes $M'' \otimes w'$ using at most r+1 symbols of storage. When r<k then the process herein described with reference to FIG. 21 can be used to generate the redundant symbols using an in-place transformation that uses at most k+1 symbols of storage. Let v identify the first r symbols in w' and let v' identify the last k−r symbols in w'. Initially w' stores the k source symbols to be encoded. At the end of the process, the first r entries of w', i.e. v, stores the r redundant symbols of the encoding. Let B be the matrix of format (r,r) that is identical with the first r columns of M", and let B' be the matrix of format (r,k−r) that is identical with the last k−r columns of M". In Step 2110 of FIG. 21, B is factored into P, L, and U, where each of these matrices is of format (k,k), and where P is a permutation matrix, L is a lower triangular matrix and U is an upper triangular matrix, and thus B=P·L·U. Such a decomposition can be calculated with a variety of approaches, for example, using the Gaussian elimination algorithm, or, when the matrix B is a Cauchy matrix, then this PLU-decomposition can be calculated with a formula, thereby reducing the computational complexity of the computation. In Step 2120, the in-place transformation U↓v is computed. In Step 2130, the in-place transformation L↑v is computed. In Step 2140, the in-place transformation P⊗v is computed. In Step 2150, v is updated to v⊕B'⊗v' using a small variant of a straightforward matrix multiplication such as the "simple transformation process" described in the section above titled "Linear Operators". In Step 2160 the processing stops because the in-place transformation is complete.

In a communications channel where sent symbols can be erased before reception, the decoding problem is that of determining the vector v of original source symbols, from the knowledge of sufficiently many encoded symbols, i.e., from the knowledge of sufficiently many entries of w, where the encoding is defined by M⊗v=w. In the case of Reed-Solomon codes, the phrase "sufficiently many symbols" may translate to as few as k symbols, or more than k symbols, depending on the application and on the computational and storage resources available for decoding.

In what follows, we describe an exemplary application of the general in-place transformation methods described above to the problem of in-place decoding of systematic Reed-Solomon codes. The disclosed method can be easily generalized after review of this disclosure by one of ordinary skill in the field to the other cases of Reed-Solomon decoding, such as the non-systematic version.

Figure 22:
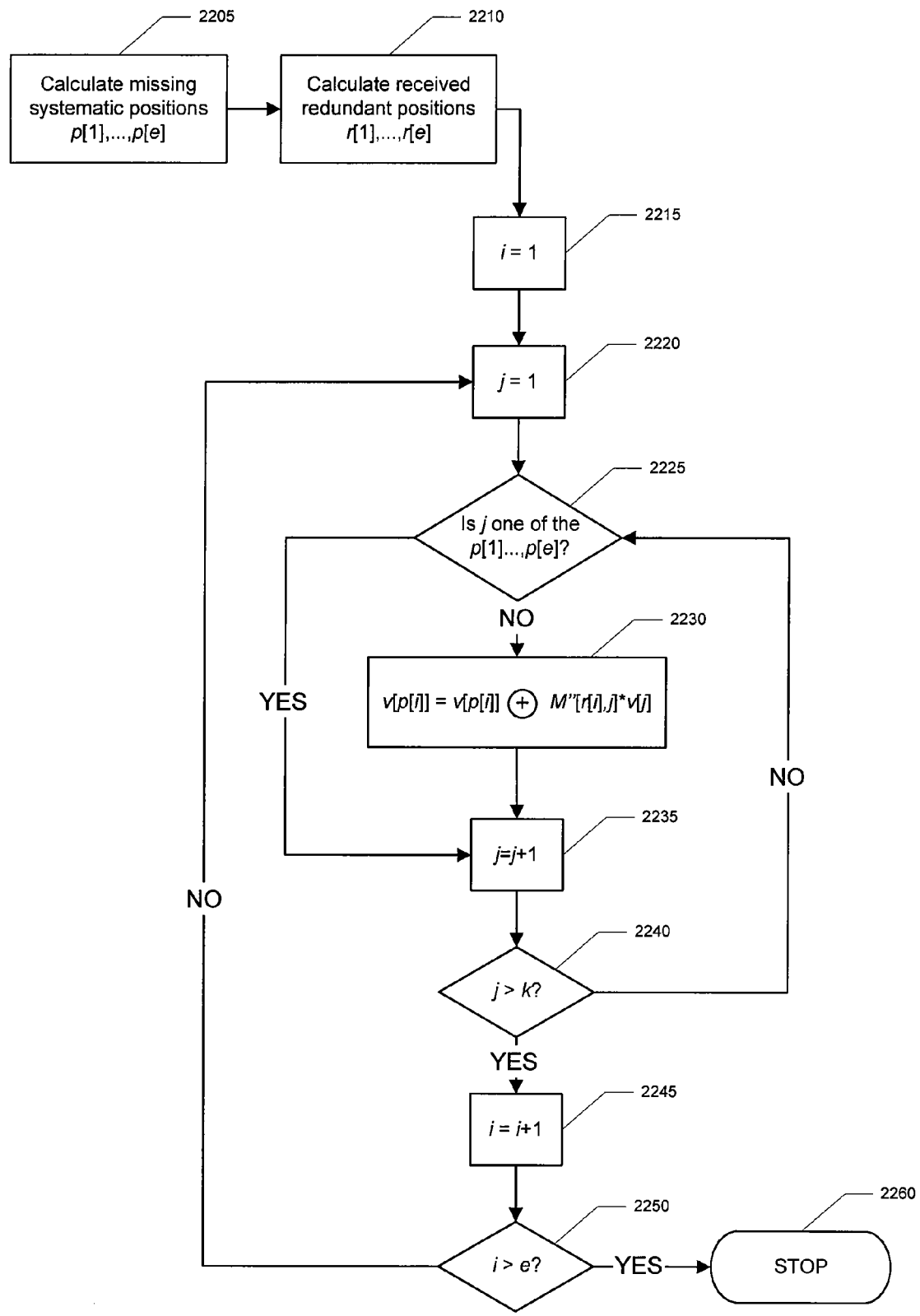
FIG. 22 is a flowchart of a method.

A method of in-place decoding of systematic Reed-Solomon codes is now described with reference to FIG. 22 and FIG. 23. In the exemplary process depicted in FIG. 22, Step 2205 identifies the erased source symbol positions denoted by p[1], . . . , p[e] with respect to the columns of matrix M", and Step 2210 identifies the positions r[1], . . . , r[e] of the redundant symbols received with respect to the rows of matrix M". For the exemplary process depicted in FIG. 22, we assume that the received symbols are stored in a column vector v of k symbols, where the symbols in positions p[1], . . . , p[e] are the received redundant symbols, where the symbols in the other k−e positions of v are the received source symbols in their proper position, and the task of the decoder is to transform v at positions p[1], . . . , p[e] into the missing e source symbols. An outer loop on a variable i is defined in Steps 2220 through 2250, effectively running these steps for values of i between 1 and the number e of erased source positions. Before entering this loop, the value of i is initialized to 1 in Step 2215. The loop in Steps 2225 through 2240 goes over values of j between 1 and k, not equal to any of the p[1], . . . , p[e], and for each such j updates v[p[i]] by adding its value with the value of M"[r[i],j]*v[j].

Figure 23:
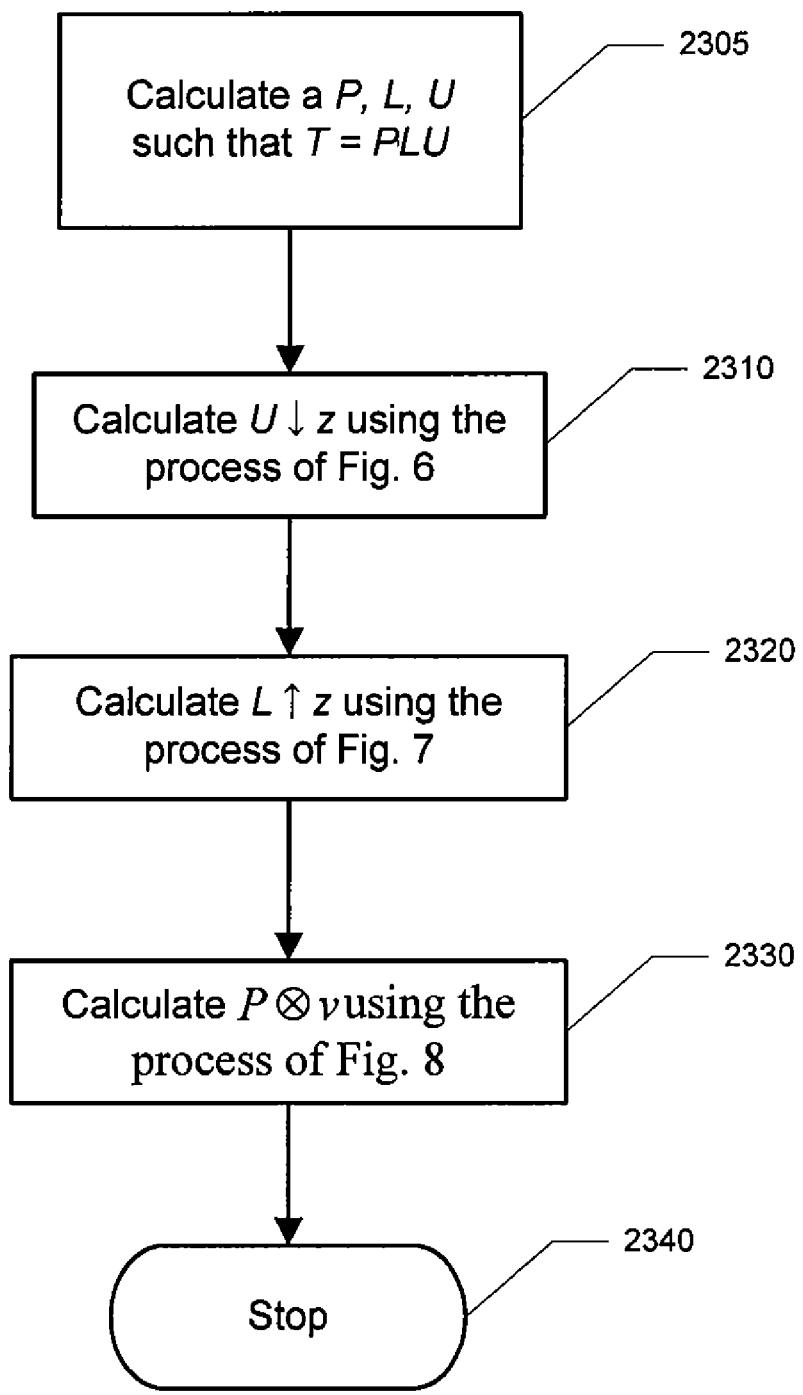
FIG. 23 is a flowchart of a method.

In the process of FIG. 23, we denote by z the vector formed by v[p[1]], . . . , v[p[e]], and by T the inverse of the matrix formed by rows r[1], . . . , r[e] and columns p[1], . . . , p[e] of the matrix M". The general theory of Reed-Solomon codes shows that this matrix is always invertible, as is well-known by one of ordinary skill in the art. This inverse, and a PLU-decomposition thereof are calculated in Step 2305. Such a PLU-decomposition can be calculated with a variety of approaches, for example, using the Gaussian elimination algorithm, or, when the matrix M" is a Cauchy matrix, then this PLU-decomposition can be calculated with a formula, thereby reducing the computational complexity of the computation. Note that the PLU-decomposition of T may be calculated directly by this process without necessarily explicitly calculating the matrix T. In Step 2310, the in-place transformation U↓z is calculated using the process described in FIG. 6. In Step 2320, L↑z is calculated using the process in FIG. 7. In Step 2330, the in-place transformation P⊗z is calculated using the process in FIG. 8. In Step 2340, the process stops because the in-place decoding for Reed-Solomon codes is complete.

The overall in-place transformation described with reference to FIG. 23 uses storage for at most k+1 symbols during the processing.

The process described herein for Reed-Solomon codes is for demonstrative purposes only and is not intended to limit the scope of this invention. More generally, very similar methods can be applied to the in-place decoding of similar classes of codes, such as Algebraic-Geometric codes (AG-codes, for short), BCH codes, or any other class of codes for which generator matrices are known explicitly.

Generalized Repeat-Accumulate (GRA) Codes

Generally, these are systematic codes, where k is the number of source symbols, r is the number of redundant symbols and thus n=k+r is the total number of symbols in the encoding. In this case, the column vector z of r redundant symbols is constructed as follows from the column vector v of k source symbols: a matrix A is chosen of format (r,k), and another matrix U is chosen of format (r,r) that is a sparse upper or lower triangular matrix. For this example description, U is arbitrarily selected as an upper triangular matrix. Then, $$z = U^{-1} \cdot A \otimes v.$$

The case of irregular repeat accumulate (IRA) codes commonly found in literature is a special case of this construction in which A is assumed to be a binary matrix randomly sampled from a set of matrices with prescribed distribution of number of 1's in each row and each column, and U is the upper triangular matrix having 1's on the main diagonal and 1's on the diagonal just above the main diagonal and zeroes in all other entries, and thus U is sparse. Note that for this example, $U^{-1}$i is the dense upper triangular matrix with 1's in all entries on and above the main diagonal. Thus, suppose for example that A is a square matrix chosen to have three 1's in each row and three 1's in each column. In this example, the computed redundant symbols have a very non-regular dependency on the source symbols, e.g., the last redundant symbol in z is the XOR of 3 of the source symbols in v, the second to last redundant symbol in z is the XOR of 6 of the source symbols in v, etc.

Figure 24:
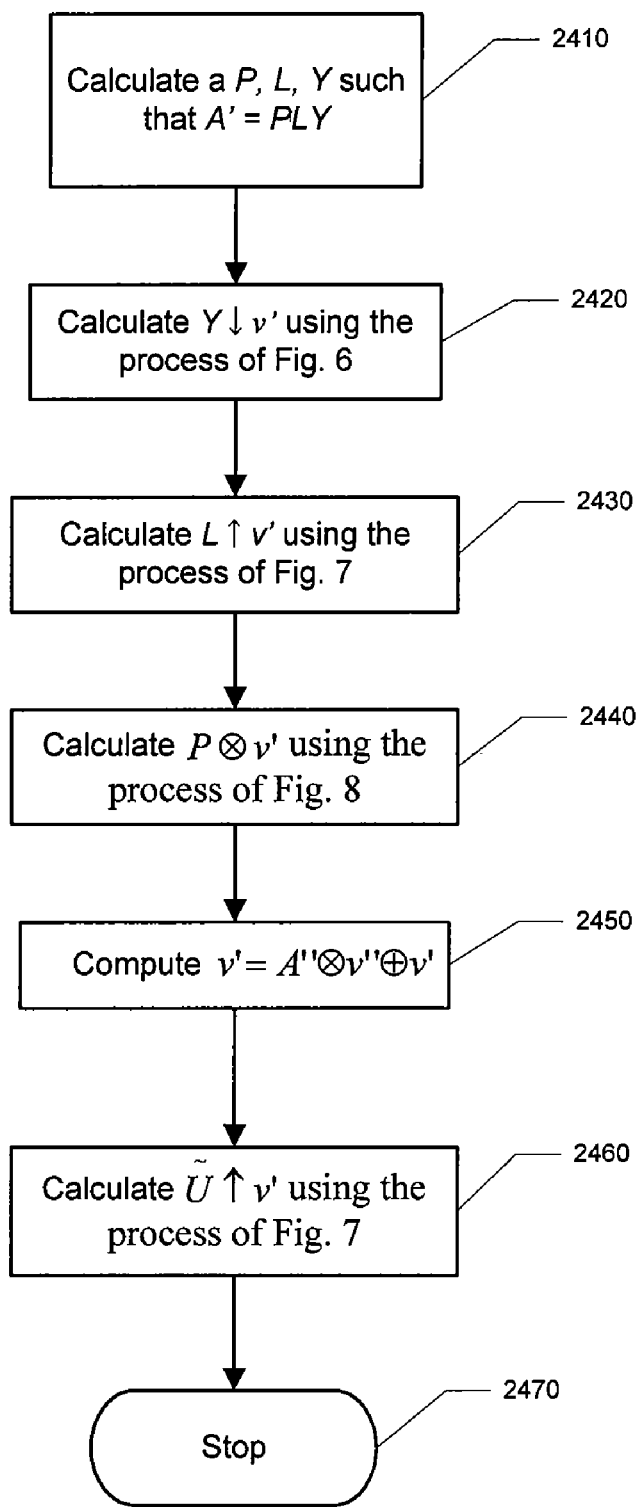
FIG. 24 is a flowchart of a method.

An in-place encoding process for a GRA code is now described with reference to FIG. 24. For this explanation it is assumed that r is at most k, i.e., the number of redundant symbols is at most the number of source symbols. For the case when r greater than k, the process can be modified, using an in-place process for multiplying a matrix with more rows than columns by a column vector of symbols instead of an in-place process for multiplying a matrix with more columns than rows by a column vector of symbols. Let A' identify the square matrix formed by the first r columns of A, and let A" identify the matrix formed by the last k−r columns of A. Let v be a column vector of k symbols that initially holds the source symbols, and let v' identify the first r symbols of v and let v" identify the last k−r symbols of v. In Step 2410 of FIG. 24, the matrix A' is factored into P, L, Y, where P is a permutation matrix, L is a lower triangular matrix and Y is an upper triangular matrix, and A'=P·L·Y. A variety of methods can be used to perform this factorization, including using standard Gaussian elimination. In Step 2420 the in-place transformation Y↓v' is computed, in Step 2430 the in-place transformation L↑v' is computed, and in Step 2440 the in-place transformation P⊗v' is computed. In Step 2450, the in-place transformation v'=A"⊗v"⊕v' is computed using a small variant of a straightforward matrix multiplication such as the "simple transformation process" described in the section above titled "Linear Operators". In Step 2460 the in-place transformation Ũ↑v' is computed. In Step 2470 computation stops with the resulting r redundant symbols stored in the first r symbols of v, i.e., in v'.

There are many variations on the process described with reference to FIG. 24. For example, Steps 2410, 2420, 2430 and 2440 can be replaced with a more sophisticated approach such as that disclosed in U.S. Pat. No. 6,856,263 entitled "Systems and Processes for Decoding Chain Reaction Codes Through Inactivation," (hereinafter "Inactivation Decoder") to write the matrix A in a form similar to that shown in FIG. 11 and then use a variation on the process described with reference to FIG. 17 to compute A⊗v using an in-place transformation. For example if A is a square matrix, i.e. r=k, chosen randomly to have three 1's in each row and three 1's in each column then it is possible to put A into the form shown in FIG. 11 where the submatrix L is of format approximately (0.86k, 0.86k) and where the submatrix C is of format approximately (0.14k, 0.14k). In this case, the in-place transformation process described with reference to FIG. 17 can be used, thereby minimizing the number of symbols used for storage during the process. As another variant, the in-place transformation process described with reference to FIG. 18 can be used to compute A⊗v, thereby using the 3·k symbol operations, i.e., the same number of symbol operations as would be used to compute A⊗v in a straightforward way, but using storage for only 1.14·k symbols.

In-Place Decoding of Chain Reaction Codes

Chain reaction codes are described in U.S. Pat. No. 6,307,487 entitled "Information Additive Code Generator and Decoder for Communications Systems," and U.S. patent application Ser. No. 10/032,156 entitled "Multi-Stage Code Generator and Decoder for Communications Systems." Several decoders have been designed for such codes, for example the decoder disclosed in "Inactivation Decoder". In that decoder, the decoding process is reduced to solving a system of linear equations of the form $$T \otimes x = z$$

wherein T is a matrix of format (s,n) of rank n, where s is at least n, where n is the number of intermediate symbols, where k is the number of source symbols, r is the number redundant symbols and thus n=k+r. Note that the number r of redundant symbols is zero for some embodiments of chain reaction codes, whereas for other embodiments the number r of redundant symbols is greater than zero. The rows of T correspond to dynamic output symbols and to the redundant (pre-coding) symbols, x is a vector of n symbols with initially unknown values that are to be solved for, comprising the source symbols and the redundant (pre-coding) symbols, and z is a vector of s symbols with known values comprising the received symbols and the check symbols of the pre-code. In some applications, the check symbols have value 0, while in others this value may be different from 0. No matter how the check symbol values are set, they are known to the decoder either through prior communication between the encoder and the decoder or by other steps.

An "Inactivation Decoder" uses a process for solving the unknown symbols x by transforming the matrix T into a form T=Q·M·P, wherein Q is a permutation matrix of format (s,s) and P is a permutation matrix of format (n,n), and M is a matrix of format (s,n) and of rank n having a form similar to that shown in FIG. 11, except that B and C both comprise s-m rows instead of n-m rows. Therein, the matrix L is a lower triangular binary matrix of format (m,m), and A, B, and C are matrices of appropriate sizes; in preferred applications A and L may be a sparse matrices, i.e., they may not have many non-zero positions. Using this factorization, the problem of recovering the unknown vector x from the received vector of symbols z may be translated to the problem of (a) calculating $Q^{-1} \otimes z$, preferably in-place so that the result is also stored in z, (b) solving the system of equations M⊗y=z, for the unknown vector y, preferably in-place so that the result y is stored in the first n entries of z, and (c) calculating x as $x=P^{-1} \otimes y$, preferably in-place so that the result x is stored in the first n entries of z. These steps can be performed concurrently with one another. Tasks (a) and (c) are described above in a prior section herein, for example the process described with reference to FIG. 8 is one way to perform tasks (a) and (c) using an in-place transformation.

An embodiment of a process for solving M⊗y=z, for the unknown vector y given z is now provided with reference to FIG. 11, FIG. 12, FIG. 13A, FIG. 13B, FIG. 14, FIG. 15, FIG. 16 and FIG. 19, where S identifies the vector of the s symbols stored in z at the beginning of the process, and where the first n symbols of S is equal to the vector y at the end of the process. One difference between the process described with reference to FIG. 19 and the current process is that M has s rows instead of the n rows shown in FIG. 11. Thus, a first step in the current embodiment is to determine n rows of M that together form a matrix of rank n and then redefine M to be the resulting full rank square matrix of format (n,n). The remaining steps in the current embodiment is to perform the process described previously with reference to FIG. 19, referring to FIG. 1, FIG. 12, FIG. 13A, FIG. 13B, FIG. 14, FIG. 15 and FIG. 16.

There are many variations on the embodiment just described. For example, instead of determining which n rows of the original matrix M of format (s,n) to use in the first step, the submatrices L, A, B and C can be determined incrementally as the process proceeds using for example the methods described in "Inactivation Decoder". Thus, a variant of the process described in Steps 1910 and 1930 of FIG. 19 can be performed using the methods described in "Inactivation Decoder" to incrementally form the matrices and perform the equivalent of the steps described in Steps 1910 and 1930 of FIG. 19. At the end of these steps, the n rows of M that have rank n have been determined and these rows of M have been logically manipulated into the form shown in FIG. 11. The remainder of the steps shown in FIG. 19 can then be applied in the appropriate order to complete the in-place transformation process.

There are many variations on the two embodiments just described, as one skilled in the art will recognize. For example, the variants of the process described with reference to FIG. 19 apply to these two embodiments as well.

In-Place Systematic Encoding of Chain Reaction Codes

In U.S. application Ser. No. 10/677,624 entitled "Systematic Encoding and Decoding of Chain Reaction Codes" filed for Shokrollahi et al. (hereinafter "Shokrollahi I"), a method is described for systematic encoding of chain reaction codes, and in particular, multi-stage chain reaction codes. In this method, the source symbols are first transformed to a set of intermediate symbols using a linear transformation. This transformation is of the form $$T \otimes x = z$$

wherein T is a full rank matrix of format (n,n) with rows corresponding to source symbols and to the redundant (pre-coding) symbols, x is a vector of intermediate symbols with initially unknown values that are to be solved for, and z is a vector of n symbols with known values, corresponding to the source symbols and the check symbols of the pre-code.

This system of equations when T is a square matrix is a special case of the more general case described in section "In-place Decoding of Chain Reaction Codes". Thus, the embodiments of in-place transformations described in the section "In-place Decoding of Chain Reaction Codes" can be used to compute the intermediate symbols from known source symbols using an in-place transformation.

In-Place Systematic Decoding of Chain Reaction Codes

The method described in Shokrollahi I performs a series of steps to obtain all the source symbols from any combination of some of the source symbols, and some output symbols generated by the systematic encoder. In preferred embodiments of this method, all the received symbols comprising some of the source symbols and the other output symbols are collected and decoded to obtain a set of intermediate symbols. Next, the intermediate symbols are transformed to obtain the missing source symbols. The in-place calculation of the intermediate symbols from the received symbols is the same as described above under the heading "In-place Decoding of Chain Reaction Codes". In this section, we will describe the in-place calculation of the source symbols from the intermediate symbols. As is apparent from Shokrollahi I, and similar to the case described above, this problem can be reduced to the problem of calculating $$T \otimes S$$

wherein T is a matrix of format (n,n) that is full rank and S is a column vector of the n intermediate symbols. The matrix T can be represented as $$T = P \cdot M \cdot Q$$

wherein P and Q are permutation matrices of format (n,n), and M is a matrix of format (n,n) of the form shown in FIG. 11.

An embodiment of an in-place transformation that computes $T \otimes S$ is the process described with reference to FIG. 17, that also refers to FIG. 11, FIG. 12, FIG. 13A, FIG. 13B, FIG. 14, FIG. 15, FIG. 16 and FIG. 17. This embodiment uses storage for n+1 symbols at most during the process. The variations of the process described with reference to FIG. 17 also apply to this embodiment.

A second embodiment of an in-place transformation that computes $T \otimes S$ is the process described with reference to FIG. 18. This embodiment uses storage for n+(n-m)+1 at most during the process. In preferred embodiments of chain reaction codes, n-m is small relative to the value of n, and thus the relative size of the symbol storage used during the process is slightly larger than n. The variations of the process described with reference to FIG. 18 also apply to this embodiment.

Embodiments described above that compute intermediate symbols from received output symbols using in-place transformation processes and embodiments described above that compute source symbols from recovered input symbols using in-place transformation processes can be combined to provide overall embodiments that compute source symbols from received output symbols using in-place transformations, where the storage for symbols used by the combination of such two processes is at most the storage for symbols used by either process individually.

The above description is only for descriptive purposes, and is not intended to limit the scope of this invention. Many equivalent versions and methods are possible upon reading the present disclosure. For example, in the above method, the calculation of the LU-decomposition of the matrix D in step 2 could have been done offline.

As has now been described, a novel memory-efficient approach to structuring a linear transform operation is taught. In examples shown herein, a linear transform process is a process of applying a linear transform to a plurality of input elements to derive a plurality of output elements. In processes described herein, memory is allocated for storing the input elements that are available for the linear transform process and at least some of that memory is reused for storing the derived output elements. Using such an approach, instead of requiring a memory large enough to hold the plurality of input elements and a memory large enough to hold the plurality of output elements, a memory sufficient to hold the largest of the pluralities (plus some small overhead, if needed) will work, saving valuable memory space.

The techniques described herein can be used for a variety of linear transforms, such as transforms for FEC encoding or decoding, erasure encoding or decoding, error correction or the like. FEC coding can involve codes such as Reed-Solomon codes, chain reaction codes, multi-stage chain reaction codes or any other linear code. Logic for performing the transform can read input elements to generate output elements and reuse memory for used-up input elements for storing generated output elements (or intermediate elements, that then might be in turn used up).

While the invention has been described with respect to exemplary embodiments, one skilled in the art will recognize that numerous modifications are possible. For example, the processes described herein may be implemented using hardware components, software components, and/or any combination thereof. Thus, although the invention has been described with respect to exemplary embodiments, it will be appreciated that the invention is intended to cover all modifications and equivalents within the scope of the following claims.

What is claimed is:

1. In an encoder that encodes data arranged as a plurality of source symbols into an plurality of encoded symbols, a method of performing a transformation from the source symbols to the encoded symbols, wherein some number, k, of the source symbols are to be transformed into n encoded symbols, the method comprising:

accessing the k source symbols, stored in a first memory;

performing a first transformation step to compute an operation of a matrix operating on the k source symbols to produce an intermediate set of output symbols, at least some of the intermediate set comprising some of the n encoded symbols;

storing the intermediate set of output symbols in the first memory, replacing at least some of the k source symbols, the number of output symbols in the intermediate set being less than the number n; and repeating the performing and storing steps at least once until the first memory contains at least the n encoded symbols and less than all of the k source symbols.

2. The method of claim 1, wherein the maximum number of symbols in the first memory over a transformation process is not greater than the greater of n+1 and k+1.

3. The method of claim 1, wherein the maximum number of symbols in the first memory over a transformation process is much closer to the greater of n+1 and k+1 than it is to k+n.

4. The method of claim 1, wherein n is not equal to k.

5. The method of claim 1, wherein n is equal to k.

6. The method of claim 1, wherein the transformation represents a Reed-Solomon encoding.

7. The method of claim 1, wherein the transformation represents a GRA encoding.

8. The method of claim 1, wherein the transformation represents a chain-reaction encoding.

9. The method of claim 1, wherein the transformation represents an LDPC encoding.

10. The method of claim 1, wherein the number of symbol operations used in the transformation is approximately proportional to the number of non-zero elements of the matrix.

11. The method of claim 1, wherein the number of symbol operations used in the transformation is approximately proportional to the number of non-zero elements of the inverse of the matrix.

12. The method of claim 1, wherein the matrix comprises a decomposition of an encoding matrix that allows for in place encoding.

13. The method of claim 1, wherein the matrix represents a code that allows for efficient in place encoding.

14. In an decoder that decodes data arranged as a plurality of encoded source symbols into an plurality of decoded symbols, a method of performing a transformation from the encoded symbols to the decoded symbols, wherein some number, r, of the encoded symbols are to be transformed into d decoded symbols, the method comprising:

accessing the r encoded symbols, stored in a first memory;

performing a first transformation step to compute an operation of a matrix, the operation being an inverse of an encoding matrix, operating on the r encoded symbols to produce an intermediate set of output symbols, at least some of the intermediate set comprising some of the d decoded symbols;

storing the intermediate set of output symbols in the first memory, replacing at least some of the r encoded symbols, the number of output symbols in the intermediate set being less than the number d; and repeating the performing and storing steps at least once until the first memory contains at least the d decoded symbols and less than all of the r encoded symbols.

15. The method of claim 14, wherein the maximum number of symbols in the first memory over a transformation process is not greater than the greater of r+1 and d+1.

16. The method of claim 14, wherein the maximum number of symbols in the first memory over a transformation process is much closer to the greater of r+1 and d+1 than it is to r+d.

17. The method of claim 14, wherein r is not equal to d.

18. The method of claim 14, wherein r is equal to d.

19. The method of claim 14, wherein the transformation represents a Reed-Solomon decoding.

20. The method of claim 14, wherein the transformation represents a GRA decoding.

21. The method of claim 14, wherein the transformation represents a chain-reaction decoding.

22. The method of claim 14, wherein the transformation represents an LDPC decoding.

23. The method of claim 14, wherein the number of symbol operations used in the transformation is approximately proportional to the number of non-zero elements of the matrix.

24. The method of claim 14, wherein the number of symbol operations used in the transformation is approximately proportional to the number of non-zero elements of the inverse of the matrix.

25. The method of claim 14, wherein the matrix comprises a decomposition of a decoding matrix that allows for in place decoding.

26. The method of claim 14, wherein the matrix represents a code that allows for efficient in place decoding.

27. A communication system wherein data arranged as a plurality of k source symbols is transformed at a transmitter into a plurality of n encoded symbols, transmitted over a communication channel and at least some of the transmitted encoded symbols are received at a receiver as a plurality of r received symbols and those r received symbols are transformed into a plurality of d decoded symbols representing the k source symbols when d is not less than k, comprising:

a transmit buffer having a size such that the size of memory required for the k source symbols and the size of memory required for the n encoded symbols together totals more than the size of the transmit buffer;

transmit generating logic for generating an intermediate set of output symbols, at least some of the intermediate set comprising some of the n encoded symbols by computing an operation of an encoding matrix operating on the k source symbols;

transmit storing logic for storing the intermediate set of output symbols in the transmit buffer, replacing at least some of the k source symbols, the number of output symbols in the intermediate set being less than the number n;

flow logic to cause the transmit generating logic to generate another intermediate set of output symbols and transmit storing logic to store that intermediate set of output symbols, replacing additional ones of the k source symbols, until the transmit buffer contains at least the n encoded symbols and less than all of the k source symbols;

a transmit circuit for transmitting the n encoded symbols over the communication channel;

a receive circuit for receiving the r received symbols, wherein the r received symbols are the result of the communication channel conveying the n encoded symbols;

a receive buffer having a size such that the size of memory required for the r received symbols and the size of memory required for the d decoded symbols together totals more than the size of the receive buffer;

receive generating logic for generating an intermediate set of receive output symbols, at least some of the intermediate set of receive output symbols comprising some of the d decoded symbols by computing an operation of a decoding matrix operating on the r received symbols;

receive storing logic for storing the intermediate set of receive output symbols in the receive buffer, replacing at least some of the r received symbols, the number of receive output symbols in the intermediate set of receive output symbols being less than the number d; and flow logic to cause the receive generating logic to generate another intermediate set of receive output symbols and receive storing logic to store that intermediate set of receive output symbols, replacing additional ones of the r received symbols, until the receive buffer contains at least the d decoded symbols and less than all of the r received symbols.

28. The communication system of claim 27, wherein the logic comprises program code instructions to be executed by a programmable processor.

29. The communication system of claim 27, wherein the logic comprises hardware circuits.

30. The communication system of claim 27, wherein the logic comprises program code instructions in part and hardware circuits in part.

31. The communication system of claim 27, wherein the decoding matrix is the inverse of the portion of the encoding matrix defined by at least some of the received symbols such that the decoding matrix multiplied by the portion of the encoding matrix is exactly the identity matrix.

32. The communication system of claim 27, wherein the receiver is a mobile telephone receiver.

33. The communication system of claim 27, wherein the receiver is a receiver adapted to be used in an automobile.

34. The communication system of claim 27, wherein the transmitter is a mobile telephone transmitter.

35. The communication system of claim 27, wherein the transmitter is a transmitter adapted to be used in an automobile.

36. The communication system of claim 27, wherein the transmitter is a digital media transmitter and the receiver is a digital media receiver.

37. An encoder that encodes data arranged as a plurality of source symbols into a plurality of encoded symbols, the encoder usable with a storage device or in a transmitter to transmit data to a receiver via a channel, wherein data arranged as a plurality of k source symbols is encoded into a plurality of n encoded symbols, the encoder comprising:

an encode buffer having a size such that the size of memory required for the k source symbols and the size of memory required for the n encoded symbols together totals more than the size of the encode buffer, thereby introducing a memory constraint;

generating logic for generating an intermediate set of output symbols from the k source symbols, at least some of the intermediate set comprising some of then encoded symbols, by computing an operation of an encoding matrix operating on the k source symbols;

storing logic for storing the intermediate set of output symbols in the encode buffer, replacing at least some of the k source symbols previously stored in the encode buffer, wherein the number of output symbols in the intermediate set is less than n; and flow logic to cause the generating logic to generate an additional intermediate set of output symbols and to cause the storing logic to store the additional intermediate set, replacing additional ones of the k source symbols, until the encode buffer contains at least the n encoded symbols.

38. The encoder of claim 37, wherein the generating logic, the storing logic and the flow logic comprise program code instructions to be executed by a programmable processor.

39. The encoder of claim 37, wherein the generating logic, the storing logic and the flow logic comprise hardware circuits.

40. The encoder of claim 37, wherein the maximum number of symbols stored in the encode buffer during a transformation process is not greater than the greater of n+37 and k+37.

41. The encoder of claim 37, wherein the maximum number of symbols stored in the encodes buffer during a transformation process is much closer to the greater of n+37 and k+37 than it is to k+n.

42. The encoder of claim 37, Wherein the operation includes one of Reed-Solomon encoding, GRA encoding, chain-reaction encoding, and LDPC encoding.

43. The encoder of claim 37, wherein the number of symbol operations used in the operation is approximately proportional to the number of non-zero elements of one of the encoding matrix and the inverse of the encoding matrix.

44. A decoder that decodes data arranged as a plurality of encoded received symbols into a plurality of decoded symbols, the decoder usable with a storage device reader or in a receiver that receives data from a transmitter via a channel, wherein data arranged as a plurality of r received symbols is decoded into a plurality of d decoded symbols when d is not less than a number, k, of source symbols encoded by the plurality of r received symbols, the decoder comprising:

a decode buffer having a size such that the size of memory required for the r received symbols and the size of memory required for the d decoded symbols together totals more than the size of the decode buffer, thereby introducing a memory constraint;

generating logic for generating an intermediate set of received output symbols from the r received symbols, at least some of the intermediate set comprising some of the d decoded symbols, by computing an operation of a decoding matrix operating on the r received symbols;

storing logic for storing the intermediate set of output symbols in the decode buffer, replacing at least some of the r received symbols previously stored in the decode buffer, wherein the number of decoded symbols in the intermediate set is less than d; and flow logic to cause the generating logic to generate an additional intermediate set of received symbols and to cause the storing logic to store the additional intermediate set, replacing additional ones of the r received symbols, until the decode buffer contains at least the d decoded symbols.

* * * * *

UNITED STATES PATENT AND TRADEMARK OFFICE
CERTIFICATE OF CORRECTION

PATENT NO. : 7,644,335 B2  Page 1 of 1
APPLICATION NO. : 11/423376
DATED : January 5, 2010
INVENTOR(S) : Luby et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 640 days.

Signed and Sealed this

Twenty-first Day of December, 2010

David J. Kappos
*Director of the United States Patent and Trademark Office*